United States Patent
Cho et al.

(10) Patent No.: US 9,210,005 B2
(45) Date of Patent: Dec. 8, 2015

(54) APPARATUS AND METHOD FOR GENERATING DIFFERENTIAL SIGNAL, AND TRANSMISSION APPARATUS AND METHOD HAVING THE SAME

(71) Applicant: Electronics & Telecommunications Research Institute, Daejeon (KR)

(72) Inventors: Young Kyun Cho, Daejeon (KR); Sung Jun Lee, Daejeon (KR); Seung Hyun Jang, Daejeon (KR); Bong Hyuk Park, Daejeon (KR); Jae Ho Jung, Daejeon (KR); Kwang Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/616,444

(22) Filed: Feb. 6, 2015

(65) Prior Publication Data

US 2015/0229495 A1 Aug. 13, 2015

(30) Foreign Application Priority Data

Feb. 12, 2014 (KR) .......................... 10-2014-0016172

(51) Int. Cl.
| | | |
|---|---|---|
| *H04L 25/34* | (2006.01) | |
| *H04L 25/02* | (2006.01) | |
| *H04L 25/49* | (2006.01) | |
| *H04L 27/20* | (2006.01) | |

(52) U.S. Cl.
CPC ............ *H04L 25/0272* (2013.01); *H04L 25/49* (2013.01); *H04L 27/2071* (2013.01)

(58) Field of Classification Search
CPC . H04L 25/0272; H04L 25/49; H04L 27/2071; H04L 27/362; H03F 1/3241

USPC ................ 375/260, 264, 278, 285, 295–296; 455/110, 114.3
See application file for complete search history.

(56) References Cited

U.S. PATENT DOCUMENTS

| | | | |
|---|---|---|---|
| 2006/0290549 A1 | 12/2006 | Laroia et al. | |
| 2007/0160164 A1 | 7/2007 | Sahota | |
| 2009/0252255 A1* | 10/2009 | Lee et al. | 375/297 |
| 2012/0119841 A1* | 5/2012 | Kitamura | 332/103 |
| 2013/0141159 A1* | 6/2013 | Strange et al. | 330/136 |
| 2014/0064355 A1* | 3/2014 | Cho et al. | 375/238 |

FOREIGN PATENT DOCUMENTS

| | | |
|---|---|---|
| KR | 10-2010-0069126 A | 6/2010 |
| KR | 10-2013-0065293 A | 6/2013 |

OTHER PUBLICATIONS

Cho, Young-Kyun, et al., "20-MHz Bandwidth Continuous-Time Delta-Sigma Modulator for EPWM Transmitter," Proceedings from the International Symposium of Wireless Communication Systems (ISWCS '12), held at Paris, France, Aug. 28-31, 2012 (5 pages, in English).

Kim, Joon Kyung, et al., "60% High-Efficiency 3F LTE Power Amplifier with Three-level Delta Sigma Modulation Assisted by Dual Supply Injection," Proceedings from the IEEE MTT-S International Microwave Symposium Digest (MTT '11), held at Baltimore, Maryland, Jun. 5-10, 2011 (4 pages, in English).

* cited by examiner

*Primary Examiner* — Khanh C Tran
(74) *Attorney, Agent, or Firm* — NSIP Law

(57) ABSTRACT

Disclosed is a technique for a transmission apparatus. A method of generating a differential signal includes adding a predetermined offset to an envelope signal to generate a first signal having the same magnitude as the envelope signal with respect to 0, scaling the first signal at a predetermined rate to generate a second signal, changing a sign of the second signal to generate a third signal that is an inverted signal of the second signal, and forming a differential signal using the second signal and the third signal.

20 Claims, 25 Drawing Sheets

ENVELOPE SIGNAL

FIRST SIGNAL
(SIGNAL OFFSET)

SECOND SIGNAL
(SIGNAL SCALING)

2 —————

1 —————

0

-1 —————

DIFFERENTIAL SIGNAL

2 —————

1 —————

CM
0 —————

-1 —————

DIFFERENTIAL
SIGNAL WITH CMV

APPARATUS AND METHOD FOR GENERATING DIFFERENTIAL SIGNAL, AND TRANSMISSION APPARATUS AND METHOD HAVING THE SAME

CLAIM FOR PRIORITY

This application claims priority to Korean Patent Application No. 10-2014-0016172 filed on Feb. 12, 2014 in the Korean Intellectual Property Office (KIPO), the entire contents of which are hereby incorporated by reference.

BACKGROUND

1. Technical Field

Example embodiments of the present invention relate in general to a wireless communication apparatus and more specifically to a transmission apparatus.

2. Related Art

Next generation wireless communication systems such as Long Term Evolution (LTE) of 3rd Generation Partnership Project (3GPP) and Worldwide Interoperability for Microwave Access (WiMAX) of Institute of Electrical and Electronics Engineers (IEEE) use wideband signals that are modulated through Orthogonal Frequency Division Multiplexing (OFDM) for high spectral efficiency.

However, systems using OFDM such as LTE and WiMAX reduce power efficiency because of high peak-to-average power ratio (PAPR) when transmitting signals using a general linear amplifier.

To overcome this limitation, much research has been conducted to maximize power efficiency of a transmission apparatus by using a power amplifier such as a Doherty amplifier or envelope tracking amplifier.

However, the Doherty amplifier or envelope tracking amplifier has a characteristic in that a non-constant envelope signal is applied to an input of the amplifier, and thus disadvantageously the nonlinearity of the amplifier increases when a signal with high PAPR is applied to an input of the amplifier. This means that there are limitations in enhancing efficiency of a transmission apparatus that uses at least one of the above-described amplifiers.

Accordingly, in order to overcome the above-described limitations, a transmission apparatus that uses a switching power amplifier has been proposed.

A switching power amplifier has an input signal limited as an envelope signal with a constant magnitude, and thus a transmission apparatus that uses the switching power amplifier generates an input signal using an envelope delta-sigma modulator (EDSM) or envelope pulse-width modulator (EPWM).

The switching power amplifier always operates in a saturation region by using the above-described input signal encoder, thereby securing linearity of and obtaining high switching efficiency of even a non-constant envelope signal.

As such, a transmission apparatus that uses a modulated input signal is referred to as a class-S transmission apparatus. In addition, a transmission apparatus that applies a multi-level modulated input signal to the switching power amplifier is referred to as an advanced class-S transmission apparatus.

The signal quality of the class-S transmission apparatus is mainly determined by a modulator. In particular, a difference in the signal quality occurs due to a dimension and an output level of the modulator, which indicate structural performance of the modulator. Accordingly, in order to increase the signal quality of the class-S transmission apparatus, optimization of the dimension and the output level of the modulator are required.

However, in order for the class-S transmission apparatus to operate at an optimum performance, matching between a modulator and a unit that is positioned at a front or rear end thereof is also very important in addition to the structural performance of the modulator.

That is, the signal quality of the class-S transmission apparatus largely depends on how an input/output signal of the modulator is processed to match between the modulator and units that are positioned at front and rear ends thereof.

Accordingly, further research on an apparatus and method for processing an input/output signal of the modulator is needed.

SUMMARY

Accordingly, example embodiments of the present invention are provided to substantially obviate one or more problems due to limitations and disadvantages of the related art.

Example embodiments of the present invention provide an apparatus and method for generating a differential signal that may operate a transmission apparatus at an optimum performance.

Example embodiments of the present invention also provide a transmission apparatus and method including the apparatus and method for generating a differential signal that may operate the transmission apparatus at an optimum performance.

In some example embodiments, a method of generating a differential signal includes adding a predetermined offset to an envelope signal to generate a first signal having the same magnitude as the envelope signal with respect to 0; scaling the first signal at a predetermined rate to generate a second signal; changing a sign of the second signal to generate a third signal that is an inverted signal of the second signal; and forming a differential signal using the second signal and the third signal.

The method may further include, after the forming of the differential signal, adding a common mode voltage to the differential signal to generate a differential signal with the common mode voltage added.

The envelope signal may be a single-ended signal.

In other example embodiments, an apparatus for generating a differential signal includes an offset addition unit configured to add a predetermined offset to the envelope signal to generate a first signal having the same magnitude as the envelope signal with respect to 0; a signal scaling unit configured to scale the first signal at a predetermined rate to generate a second signal; a sign changing unit configured to change a sign of the second signal to generate a third signal that is an inverted signal of the second signal; and a differential signal forming unit configured to form the differential signal using the second signal and the third signal.

In still other example embodiments, a transmission apparatus including the apparatus for generating a differential signal includes a polar coordinate conversion unit configured to separate an input signal into a phase signal and an envelope signal to provide the phase signal and the envelope signal; a phase modulator configured to phase-modulate the phase signal to generate a phase-modulated signal having a constant amplitude; a differential signal generation unit configured to add a predetermined offset to the envelope signal such that the envelope signal has the same magnitude with respect to 0 and generate a differential signal based on the envelope signal with the predetermined offset added; a modulator configured to modulate the differential signal to generate a digital signal;

a multi-level signal generation unit configured to generate a multi-level signal based on the digital signal; a mixer configured to mix the phase-modulated signal and the multi-level signal to generated a mixing signal; and a power amplifier configured to perform power amplification corresponding to the mixing signal.

The differential signal generation unit may include an offset addition unit configured to add a predetermined offset to the envelope signal to generate a first signal having the same magnitude as the envelope signal with respect to 0, a signal scaling unit configured to scale the first signal at a predetermined rate to generate a second signal, a sign changing unit configured to change a sign of the second signal to generate a third signal that is an inverted signal of the second signal, and a differential signal forming unit configured to form the differential signal using the second signal and the third signal.

The differential signal generation unit may further include a voltage addition unit configured to add a common mode voltage to the differential signal to generate a differential signal with the common mode voltage added.

The multi-level signal generation unit may compensate for the predetermined offset added by the differential signal generation unit based on the digital signal to generate the multi-level signal.

The multi-level signal generation unit may include a first current control unit configured to provide a plurality of control currents based on the digital signal, a first signal generation unit configured to generate a 3-level single-ended signal compensated for the predetermined offset based on the plurality of control currents, and a first signal output unit configured to provide the 3-level single-ended signal to the mixer.

The first signal generation unit may generate a first 3-level single-ended signal compensated for the predetermined offset based on the plurality of control currents corresponding to the digital signal and generate a second 3-level single-ended signal compensated for the predetermined offset based on the plurality of control currents corresponding to an inverted signal of the digital signal, and the first signal output unit may provide one of the first 3-level single-ended signal compensated for the predetermined offset and the second 3-level single-ended signal compensated for the predetermined offset to the mixer.

The multi-level signal generation unit may include a second current control unit configured to provide a plurality of constant currents, a third current control unit configured to provide a plurality of control currents based on the digital signal, a second signal generation unit configured to generate third and fourth 3-level single-ended signals based on the plurality of constant currents and the plurality of control currents, a signal conversion unit configured to convert the third and fourth 3-level single-ended signals into a 3-level differential signal compensated for the predetermined offset, and a second signal output unit configured to provide the 3-level differential signal to the mixer.

The multi-level signal generation unit may include an output buffer configured to perform a switching operation based on the digital signal, generate a 3-level signal compensated for the predetermined offset according to a control voltage corresponding to the switching operation, and provide the 3-level signal to the mixer.

The envelope signal may be a single-ended signal.

In yet still other example embodiments, a transmission method includes separating an input signal into a phase signal and an envelope signal to provide the phase signal and the envelope signal; phase-modulating the phase signal to generate a phase-modulated signal having a constant amplitude; adding a predetermined offset to the envelope signal such that the envelope signal has the same magnitude with respect to 0 and generating a differential signal based on the envelope signal with the predetermined offset added; modulating the differential signal to generate a digital signal; generating a multi-level signal based on the digital signal; mixing the phase-modulated signal and the multi-level signal to generated a mixing signal; and performing power amplification corresponding to the mixing signal.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
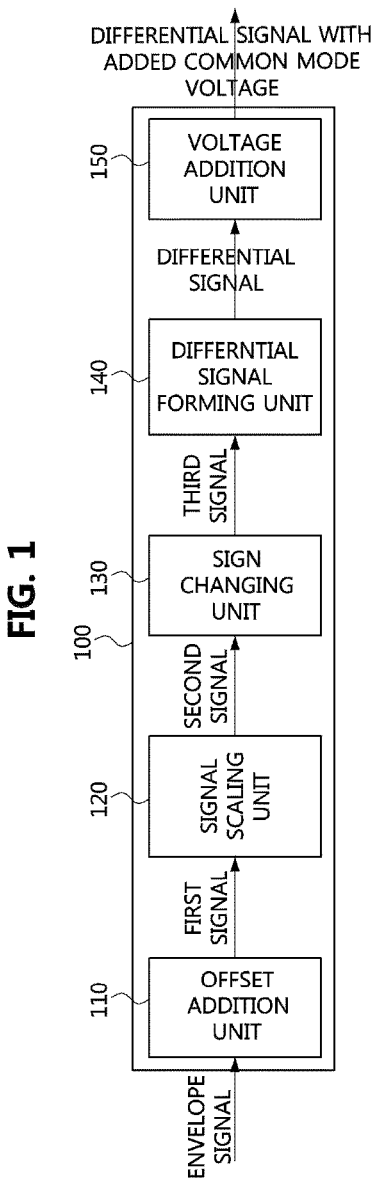
FIG. 1 is a block diagram showing an apparatus for generating a differential signal according to an embodiment of the present invention.

While the invention is susceptible to various modifications and alternative forms, specific embodiments thereof are shown by way of example in the drawings and will herein be described in detail. However, it should be understood that the present invention is not limited to these embodiments, and may include any and all modification, variations, equivalents, substitutions, and the like within the spirit and scope thereof. Like reference numerals refer to like elements throughout.

Relational terms such as first, second, and the like may be used for describing various elements, but the elements should not be limited by the terms. These terms are only used to distinguish one element from another. For example, a first component may be called a second component, and a second component may also be called a first component without departing from the scope of the present invention. The term 'and/or' means any one or a combination of a plurality of related and described items.

When it is mentioned that a certain component is "coupled with" or "connected with" another component, it should be understood that the certain component is directly "coupled with" or "connected with" to the other component or an additional component may be located therebetween. In contrast, when it is mentioned that a certain component is "directly coupled with" or "directly connected with" another component, it will be understood that no additional component is located therebetween.

The terms used in the present specification are set forth to explain the embodiments of the present invention, and the scope of the present invention is not limited thereto. The singular number includes the plural number as long as they are not apparently different from each other in the context. In the present specification, it will be understood that the terms "have," "comprise," "include," and the like are used to specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Terms such as terms that are generally used and have been in dictionaries should be construed as having meanings matching contextual meanings in the art. In this description, unless defined clearly, terms are not interpreted in an idealized or overly formal sense.

An apparatus for generating a differential signal according to an embodiment of the present invention will be described below with reference to the accompanying drawings.

FIG. 1 is a block diagram showing an apparatus for generating a differential signal according to an embodiment of the present invention.

Referring to FIG. 1, an apparatus 100 for generating a differential signal according to an embodiment of the present invention includes an offset addition unit 110, a signal scaling unit 120, a sign changing unit 130, and a differential signal forming unit 140. Also, the apparatus 100 may further include a voltage addition unit 150.

The offset addition unit 110 may receive an envelope signal. In addition, the offset addition unit 110 may add a predetermined offset to the received envelope signal to generate a first signal having the same magnitude as the envelope signal with respect to 0.

Here, the envelope signal may be a single-ended signal.

Here, the envelope signal may have a positive value.

Here, the envelope signal may be a single-ended signal having a positive value.

Here, the envelope signal may a baseband signal.

In addition, the offset addition unit 110 may provide the generated first signal to the signal scaling unit 120 to be described below.

The signal scaling unit 120 may be connected to an output of the offset addition unit 110. The signal scaling unit 120 may receive the first signal from the offset addition unit 110. In addition, the signal scaling unit 120 may scale the received first signal at a predetermined rate to generate a second signal. The signal scaling unit 120 may provide the generated second signal to the sign changing unit 130 to be described below.

The sign changing unit 130 may be connected to an output of the signal scaling unit 120. The sign changing unit 130 may receive the second signal from the signal scaling unit 120. The sign changing unit 130 may change the sign of the received second signal to generate a third signal that is an inverted second signal. In addition, the sign changing unit 130 may provide the generated third signal to the differential signal forming unit 140 to be described below.

The differential signal forming unit 140 may be connected to an output of the signal scaling unit 120 and an output of the sign changing unit 130.

Here, the differential signal forming unit 140 may receive the second signal from the signal scaling unit 120. Here, the differential signal forming unit 140 may receive the third signal from the sign changing unit 130. Here, the differential signal forming unit 140 may receive the second signal generated by the signal scaling unit 120 through the sign changing unit 130.

In addition, the differential signal forming unit 140 may form a differential signal using the received second signal and third signal. Furthermore, the differential signal forming unit 140 may provide the formed differential signal to the voltage addition unit 150 to be described below.

The voltage addition unit 150 may be connected to an output of the differential signal forming unit 140. The voltage addition unit 150 may receive the differential signal from the differential signal forming unit 140. In addition, the voltage addition unit 150 may add a common mode voltage to the received differential signal to generate a differential signal with the common mode voltage added.

A method of generating a differential signal according to an embodiment of the present invention will be described below with respect to the accompanying drawings. In particular, for brevity, repetitive description on the same elements as those of the apparatus for generating a differential signal according to an embodiment of the present invention will be omitted.

Figure 2:
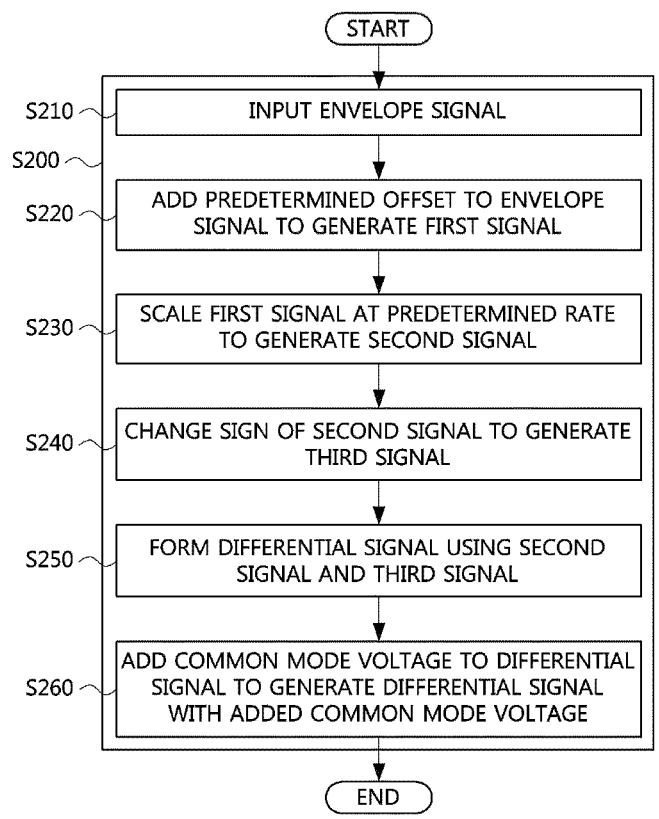
FIG. 2 is a flowchart showing a method of generating a differential signal according to an embodiment of the present invention.

FIG. 2 is a flowchart showing a method of generating a differential signal according to an embodiment of the present invention.

Referring to FIG. 2, a method (S200) of generating a differential signal according to an embodiment of the present invention includes generating a first signal (S220), generating a second signal (S230), generating a third signal (S240), and forming a differential signal (S250). Also, the method may further include generating a differential signal with an added common mode voltage (S260).

First, the method may include receiving an envelope signal (S210).

Here, since the envelope signal is the same as that described above in the apparatus 100 for generating a differential signal, repetitive description thereof will be omitted for brevity.

Subsequently, the method may include adding a predetermined offset to the envelope signal to generate a first signal having the same magnitude as the envelope signal with respect to 0 (S220).

The method may include scaling the generated first signal at a predetermined rate to generate a second signal (S230).

The method may include changing the sign of the generated second signal to generate a third signal that is an inverted second signal (S240).

The method may include forming a differential signal using the received second signal and third signal (S250).

The method may include adding a common mode voltage to the formed differential signal to generate a differential signal with the added common mode voltage (S260).

A transmission apparatus including an apparatus for generating a differential signal according to an embodiment of the present invention will be described below with respect to the accompanying drawings. In particular, for brevity, repetitive description on the same elements as those of the apparatus and method for generating a differential signal according to an embodiment of the present invention will be omitted.

Figure 3:
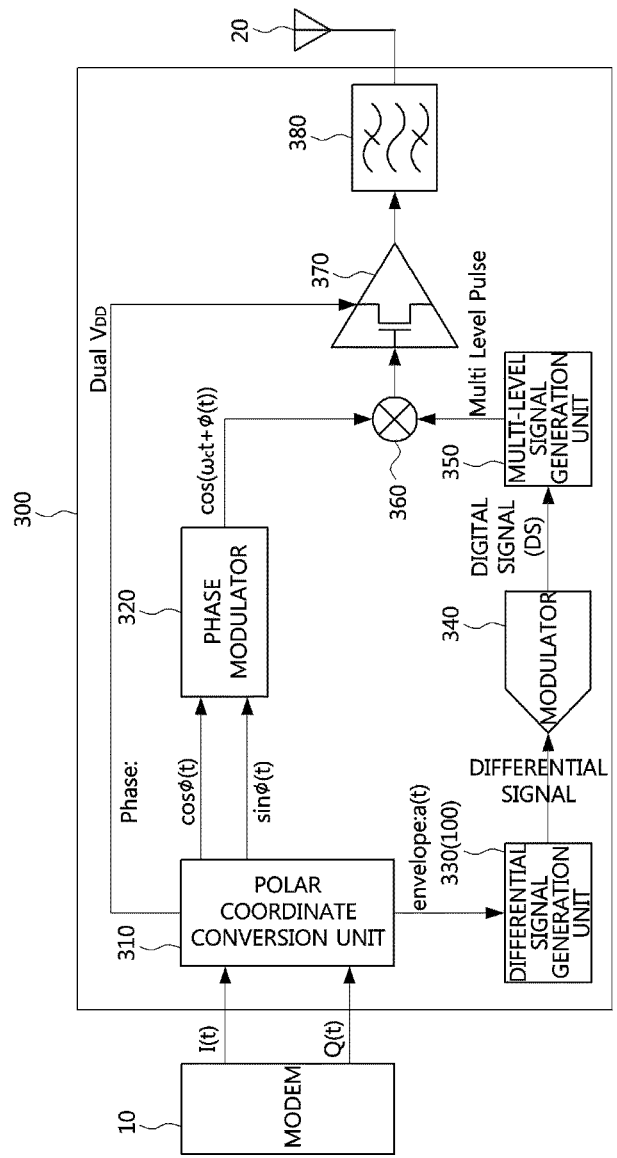
FIG. 3 is a block diagram showing a transmission apparatus including an apparatus for generating a differential signal according to an embodiment of the present invention.

FIG. 3 is a block diagram showing a transmission apparatus including an apparatus for generating a differential signal according to an embodiment of the present invention.

Referring to FIG. 3, a transmission apparatus 300 including the apparatus 100 for generating a differential signal according to an embodiment of the present invention includes a polar coordinate conversion unit 310, a phase modulator 320, a differential signal generation unit 330, a modulator 340, a multi-level signal generation unit 350, a mixer 360, and a power amplifier 370. Also, the transmission apparatus 300 may further include a filter 380.

Here, the transmission apparatus 300 may include a class-S transmission apparatus or an advanced class-S transmission apparatus.

A modem 10 may generate input signals I(t) and Q(t). Here, the input signals I(t) and Q(t) may be baseband signals. In addition, the modem 10 may provide the generated input signals I(t) and Q(t) to the polar coordinate conversion unit 310 to be described below.

The polar coordinate conversion unit 310 may be connected to an output of the modem 10. The polar coordinate conversion unit 310 may receive the input signals I(t) and Q(t) from the modem 10. In addition, the polar coordinate conversion unit 310 may convert the received input signals I(t) and Q(t) to polar coordinate signals to generate phase signals cos $\Phi(t)$ and sin $\Phi(t)$ and an envelope signal a(t).

Here, since the envelope signal a(t) is the same as that described above in the apparatus 100 for generating a differential signal, repetitive description thereof will be omitted for brevity.

The polar coordinate conversion unit 310 may include a coordinate rotation digital computer (CORDIC).

In addition, the polar coordinate conversion unit 310 may provide the generated phase signals cos $\Phi(t)$ and sin $\Phi(t)$ to the phase modulator 320 to be described below. Furthermore, the polar coordinate conversion unit 310 may provide the generated envelope signal a(t) to the differential signal generation unit 330 to be described below.

The phase modulator 320 may be connected to an output of the polar coordinate conversion unit 310. The phase modulator 320 may receive the phase signals cos $\Phi(t)$ and sin $\Phi(t)$ from the polar coordinate conversion unit 310.

In addition, the phase modulator 320 may modulate a phase of the received phase signals cos $\Phi(t)$ and sin $\Phi(t)$ to generate a phase-modulated signal cos $(\omega_c t + \Phi(t))$ having a constant amplitude. Here, the phase-modulated signal cos $(\omega_c t + \Phi(t))$ may be a radio frequency (RF) signal. Furthermore, the phase modulator 320 may provide the generated phase-modulated signal cos $(\omega_c t + \Phi(t))$ to the mixer 360 to be described below.

The differential signal generation unit 330 may be connected to an output of the polar coordinate conversion unit 310. The differential signal generation unit 330 may receive the envelope signal a(t) from the polar coordinate conversion unit 310.

In addition, the differential signal generation unit 330 may add a predetermined offset to the envelope signal a(t) such that the envelope signal a(t) has the same magnitude with respect to 0 to generate a differential signal based on the envelope signal a(t) with the added offset. Furthermore, the differential signal generation unit 330 may provide the generated differential signal to the modulator 340 to be described below.

The differential signal generation unit 330 may include an offset addition unit 110, a signal scaling unit 120, a sign changing unit 130, a differential signal forming unit 140, and a voltage addition unit 150. Here, since the differential signal generation unit 330 has the same configuration as the apparatus 100 for generating a differential signal that are shown in FIG. 1 and described in detail, for brevity, repetitive description will be omitted.

Furthermore, the differential signal generation unit 330 has been described to be positioned between the polar coordinate conversion unit 310 and the modulator 340. However, the present invention is not limited thereto. That is, the differential signal generation unit 330 may be inside the polar coordinate conversion unit 310 or modulator 340.

The modulator 340 may be connected to an output of the differential signal generation unit 330. The modulator 340 may receive the differential signal from the differential signal generation unit 330. In addition, the modulator 340 may modulate the received differential signal to generate a digital signal DS.

Here, the digital signal DS may include at least one digital signal DS.

In addition, the modulator 340 may include a delta-sigma modulator (DSM) or pulse-width modulator (PWM).

Here, the delta-sigma modulator may include an envelope delta-sigma modulator (EDSM) that performs delta-sigma modulation on an envelope signal to generate a digital signal DS.

Here, the delta-sigma modulator may include a low pass delta-sigma modulator (LPDSM).

Here, the pulse-width modulator may include an envelope pulse-width modulator (EPWM) that performs pulse-width modulation on an envelope signal to generate a digital signal DS.

Here, the modulator 340 is not limited to the above-described delta-sigma modulator and the pulse-width modulator and may include any modulator as long as the modulator can modulate a signal to generate a digital signal DS.

Furthermore, the modulator 340 may provide the generated digital signal DS to the multi-level signal generation unit 350 to be described below.

The multi-level signal generation unit 350 may be connected to an output of the modulator 340. The multi-level signal generation unit 350 may receive the digital signal DS from the modulator 340. In addition, the multi-level signal generation unit 350 may generate a multi-level signal based on the received digital signal DS.

Here, the multi-level signal generation unit 350 may generate a multi-level signal with respect to 0.

As an example, the multi-level signal generation unit 350 may generate a 2-level signal (−1/1) with respect to 0 when there is one digital signal DS. As another example, the multi-level signal generation unit 350 may generate a 3-level signal (−1/0/1) with respect to 0 when there are two digital signals DSs. As another example, the multi-level signal generation unit 350 may generate a 5-level signal (−1/−0.5/0/0.5/1) with respect to 0 when there are three digital signals DSs. As still another example, the multi-level signal generation unit 350 may generate a 2-level signal (−1/1), a 3-level signal (−1/0/1), . . . , a $2^N$-level signal (−1/ . . . /0/ . . . /1) with respect to 0 when there are N digital signals DSs.

Furthermore, the multi-level signal generation unit 350 may provide the generated multi-level signal to the mixer 360 to be described below.

The multi-level signal generation unit 350 has been described to be positioned between the modulator 340 and the mixer 360. However, the present invention is not limited thereto. That is, the multi-level signal generation unit 350 may be inside the modulator 340 or mixer 360.

The multi-level signal generation unit 350 will be described below in more detail with reference to FIGS. 4 to 8.

The mixer 360 may be connected to an output of the phase modulator 320 and an output of the multi-level signal generation unit 350. Here, the mixer 360 may receive the phase-modulated signal cos ($\omega_c$t+Φ(t)) from the phase modulator 320. Here, the mixer 360 may receive the multi-level signal from the multi-level signal generation unit 350.

In addition, the mixer 360 may mix the received phase-modulated signal cos ($\omega_c$t+Φ(t)) and multi-level signal to generate a mixing signal. Here, the mixing signal may be a zero signal or a signal having a form of a sinusoidal wave having a constant amplitude. Here, the mixing signal may drive the power amplifier 370 to be described below in a saturation mode. In addition, the mixer 360 may provide the generated mixing signal to the power amplifier 370 to be described below.

The power amplifier 370 may be connected to an output of the mixer 360. The power amplifier 370 may receive the mixing signal from the mixer 360. In addition, the power amplifier 370 may perform power amplification corresponding to the received mixing signal to generate a power-amplified signal.

The power amplifier 370 may include a class-S power amplifier. Here, the power amplifier 370 is not limited to the class-S power amplifier and may include any power amplifier as long as the power amplifier can amplify the power of the signal.

The power amplifier 370 may provide the power-amplified signal to the filter 380 to be described below.

The filter 380 may be connected to an output of the power amplifier 370. The filter 380 may receive the power-amplified signal from the power amplifier 370. In addition, the filter 380 may filter the power-amplified signal to generate a filtered power-amplified signal.

Also, the filter 380 may include a band pass filter. Here, the band pass filter may pass a signal inside a frequency band and block a signal outside the frequency band. That is, the band pass filter may perform band pass filtering on the power-amplified signal to remove out-of-band quantization noise. In addition, the filter 380 may provide the filtered power-amplified signal to an antenna 20 to be described below.

The antenna 20 may be connected to an output of the filter 380. The antenna 20 may receive the filtered power-amplified signal from the filter 380. In addition, the antenna 20 may transmit the filtered power-amplified signal to the air.

Accordingly, the modulator may be driven using the differential signal generated according to an embodiment of the present invention, thereby minimizing the noise effect of the transmission apparatus to operate the transmission apparatus at an optimum performance.

Furthermore, the differential signal generated according to an embodiment of the present invention can be provided as a full-scale input signal to the modulator, thereby further enhancing the signal quality of the transmission apparatus.

The multi-level signal generation unit according to an embodiment of the present invention will be described in detail below with reference to the accompanying drawings (FIGS. 4 to 8). In particular, for brevity, repetitive description on the same element as the multi-level signal generation unit in the transmission apparatus including the apparatus for generating a differential signal according to an embodiment of the present invention will be omitted.

The multi-level signal generation unit 350 according to an embodiment of the present invention may compensate for a predetermined offset added by the differential signal generation unit 330 based on the digital signal DS that is provided from the modulator 340, to generate a multi-level signal.

Hereinafter, "the predetermined offset added by the differential signal generation unit 330" is referred to as "a predetermined offset."

As an example, the multi-level signal generation unit 350 may generate a 2-level signal (0/2) compensated for the predetermined offset when there is one digital signal DS. As another example, the multi-level signal generation unit 350 may generate a 3-level signal (0/1/2) compensated for the predetermined offset when there are two digital signals DSs. As another example, the multi-level signal generation unit 350 may generate a 5-level signal (0/0.5/1/1.5/2) compensated for the predetermined offset when there are three digital signals DSs. As still another example, the multi-level signal generation unit 350 may generate a 2-level signal (0/2), a 3-level signal (0/1/2), . . . , a $2^N$-level signal (0/ . . . /1/ . . . /2), which are compensated for the predetermined offset when there are N digital signals DSs.

Accordingly, the transmission apparatus according to an embodiment of the present invention may drive the modulator using a differential signal generated by the apparatus for generating a differential signal and the multi-level signal generation unit compensates for a predetermined offset included in the differential signal to provide the offset-compensated differential signal to the mixer, thereby further enhancing the signal quality of the transmission apparatus.

Figure 4:
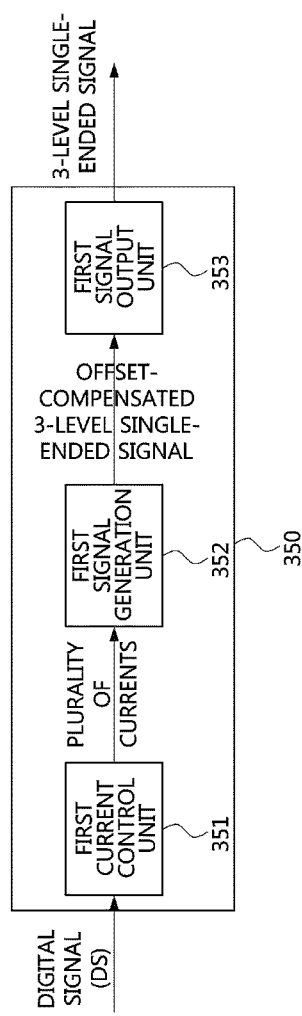
FIG. 4 is a block diagram showing a multi-level signal generation unit according to an embodiment of the present invention.

FIG. 4 is a block diagram showing a multi-level signal generation unit according to an embodiment of the present invention.

Referring to FIG. 4, the multi-level signal generation unit 350 according to an embodiment of the present invention includes a first current control unit 351, a first signal generation unit 352, and a first signal output unit 353.

The first current control unit 351 may be connected to an output of the modulator 340. The first current control unit 351 may receive the digital signal DS from the modulator 340. In addition, the first current control unit 351 may provide a plurality of control currents to the first signal generation unit 352 to be described below based on the received digital signal DS.

The first signal generation unit 352 may be connected to an output of the first current control unit 351. The first signal generation unit 352 may receive the plurality of control currents from the first current control unit 351. In addition, the first signal generation unit 352 may generate an offset-compensated 3-level single-ended signal based on the received plurality of control currents. Furthermore, the first signal generation unit 352 may provide the generated 3-level single-ended signal to the first signal output unit 353 to be described below.

The first signal output unit 353 may be connected to an output of the first signal generation unit 352. The first signal output unit 353 may receive the 3-level single-ended signal from the first signal generation unit 352. In addition, the first signal output unit 353 may provide the received 3-level single-ended signal to the mixer 360.

Figure 5:
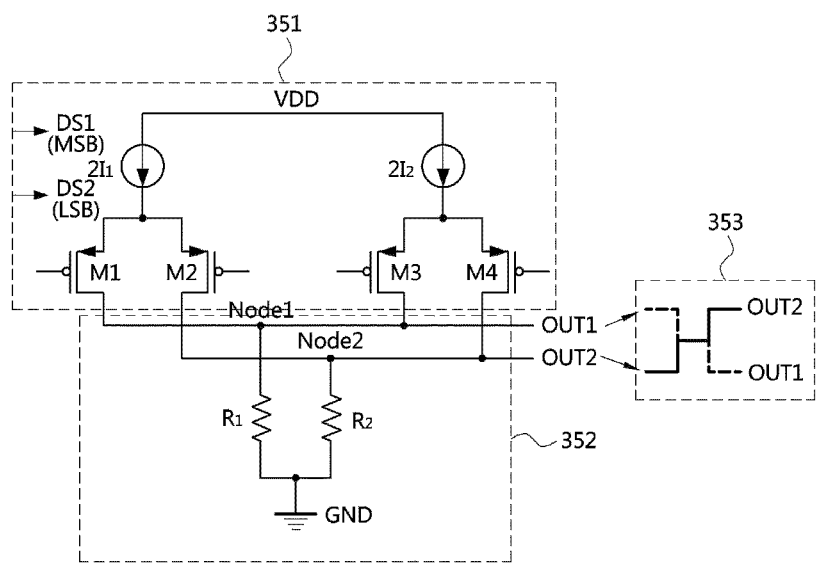
FIG. 5 is a circuit diagram showing a circuit of the multi-level signal generation unit shown in FIG. 4 and a state table showing an operation state.

FIG. 5 is a circuit diagram showing a circuit of the multi-level signal generation unit shown in FIG. 4 and a state table showing an operation state.

Referring to FIG. 5, in the multi-level signal generation unit 350 according to an embodiment of the present invention, the first signal generation unit 352 may generate a first 3-level single-ended signal OUT1 compensated for the predetermined offset based on a plurality of control currents corresponding to the digital signal DS. In addition, the first signal generation unit 352 in the multi-level signal generation unit 350 may generate a second 3-level single-ended signal OUT2 compensated for the predetermined offset based on the plurality of control currents corresponding to an inverted signal of the digital signal DS. The first signal output unit 353 in the multi-level signal generation unit 350 may provide any one of the first 3-level single-ended signal OUT1 and the second 3-level single-ended signal OUT2 to the mixer.

The first current control unit 351 may provide the plurality of control currents corresponding to the digital signal DS and the inverted signal of the digital signal DS. Here, the digital signal DS may include a first digital signal DS1 and a second digital signal DS2.

In particular, the first digital signal DS1 may be a most significant bit (MSB). The second digital signal DS2 may be a least significant bit (LSB).

The first current control unit 351 may include a plurality of transistors and a plurality of current sources.

Here, the plurality of current sources may provide a control current. Here, the plurality of current sources may have the same value. Here, the plurality of current sources may include two current sources $2I_1$ and $2I_2$. One ends of the two current sources $2I_1$ and $2I_2$ may be connected to a voltage VDD.

Here, the plurality of transistors may include four transistors M1 to M4. The four transistors M1 to M4 may perform a turn-on or turn-off operation according to a signal applied to gates of the transistors.

Two transistors M1 and M3 may perform a turn-on or turn-off operation according to the digital signals DS1 and DS2 applied to gates of the transistors M1 and M3. Two transistors M2 and M4 may perform a turn-on or turn-off operation according to inverted signals of the digital signals DS1 and DS2 applied to gates of the transistors M2 and M4.

The transistors M1 to M4 may be turned off when a signal applied to gates of the transistors M1 to M4 is logically high and turned on when a signal applied to the gates is logically low.

The first transistor M1 may include a gate, a source, and a drain. Here, the gate of the first transistor M1 may receive the first digital signal DS1. The source of the first transistor M1 may be connected to the other end of the first current source $2I_1$. The drain of the first transistor M1 may be connected to a first node.

The second transistor M2 may include a gate, a source, and a drain. Here, the gate of the second transistor M2 may receive an inverted signal of the first digital signal DS1. The source of the second transistor M2 may be connected to the other end of the first current source $2I_1$. The drain of the second transistor M2 may be connected to a second node.

The third transistor M3 may include a gate, a source, and a drain. Here, the gate of the third transistor M3 may receive the second digital signal DS2. The source of the third transistor M3 may be connected to the other end of the second current source $2I_2$. The drain of the third transistor M3 may be connected to the first node.

The fourth transistor M4 may include a gate, a source, and a drain. Here, the gate of the fourth transistor M4 may receive an inverted signal of the second digital signal DS2. The source of the fourth transistor M4 may be connected to the other end of the second current source $2I_2$. The drain of the fourth transistor M4 may be connected to the second node.

Each of the transistors M1 to M4 may be, but not limited to, a p-channel metal-oxide-semiconductor (PMOS) transistor as shown in FIG. 5 and may include any device as long as the device can provide a control current according to a switching operation.

The first signal generation unit 352 may include a plurality of resistors. Here, the plurality of resistors may include two resistors R1 and R2. The first resistor R1 may be connected between the first node and the ground. The second resistor R2 may be connected between the second node and the ground. In particular, the first resistor R1 and the second resistor R2 may have the same value.

The first resistor R1 may receive control currents $2I_1$ and $2I_2$ from the first and third transistors M1 and M3. In addition, the first resistor R1 may generate an offset-compensated first 3-level single-ended signal OUT1 corresponding to the received control currents $2I_1$ and $2I_2$.

The second resistor R2 may receive the control currents $2I_1$ and $2I_2$ from the second and fourth transistors M2 and M4. In addition, the second resistor R2 may generate an offset-compensated second 3-level single-ended signal OUT2 corresponding to the received control currents $2I_1$ and $2I_2$.

The first and second 3-level single-ended signals OUT1 and OUT2 may be complementary signals.

The first signal output unit 353 may receive the first and second 3-level single-ended signals OUT1 and OUT2 from the first signal generation unit 352. The first signal output unit 353 may provide, to the mixer 360, any one of the received first and second 3-level single-ended signals OUT1 and OUT2.

Referring to the state table of FIG. 5, the modulator 340 according to an embodiment of the present invention may include two comparators. That is, the modulator 340 may output the digital signals DS1 and DS2 using the two comparators. Here, the modulator 340 may be a delta-sigma modulator.

When the digital signals DS1 and DS2, which are outputs of the comparators, are 0, 0/0, 1/1, 1, the delta-sigma modulator has −1/0/1 that is a corresponding output code.

In this case, the multi-level signal generation unit 350 according to an embodiment of the present invention may generate the first and second 3-level single-ended signals OUT1 and OUT2 based on the digital signals DS1 and DS2.

For example, when the digital signals DS1 and DS2 are logically low, the first and third transistors M1 and M3 are turned on upon receiving the digital signals DS1 and DS2, and the second and fourth transistors M2 and M4 are turned off upon receiving the inverted signals of the digital signals DS1 and DS2.

Thus, the first 3-level single-ended signal OUT1 may have a voltage value of 4I×R. The second 3-level single-ended signal OUT2 may have a voltage value of 0.

When one of the first digital signal DS1 and the second digital signal DS2 is logically low and the other is logically high, a transistor to which the logically low digital signal is applied between the first and third transistors M1 and M3 that receive the digital signals DS1 and DS2 is turned on, and a transistor to which the logically high digital signal is applied is turned off.

When one of the inverted signals of the first digital signal DS1 and the second digital signal DS2 is logically low and the other is logically high, a transistor to which the logically low inverted signal is applied between the second and fourth transistors M2 and M4 that receive the inverted signals of the digital signals DS1 and DS2 is turned on, and a transistor to which the logically high inverted signal is applied is turned off.

Thus, the first and second 3-level single-ended signals OUT1 and OUT2 may have a voltage value of $2I \times R$.

When the digital signals DS1 and DS2 are logically high, the first and third transistors M1 and M3 are turned off upon receiving the digital signals DS1 and DS2, and the second and fourth transistors M2 and M4 are turned on upon receiving the inverted signals of the digital signals DS1 and DS2.

Thus, the first 3-level single-ended signal OUT1 may have a voltage value of 0. In addition, the second 3-level single-ended signal OUT2 may have a voltage value of $4I \times R$.

Accordingly, the second 3-level single-ended signal OUT2 may have a voltage value of 0, $2I \times R$, and $4I \times R$. Here, it can be seen that the second 3-level single-ended signal OUT2 may represent an output code of 0/1/2.

In addition, the first 3-level single-ended signal OUT1 may have a voltage value of $4I \times R$, $2I \times R$, and 0. Here, it can be seen that the first 3-level single-ended signal OUT1 may represent an output code of 2/1/0, which is complementary to the second 3-level single-ended signal OUT2.

Subsequently, the first signal output unit 353 of the multi-level signal generation unit 350 according to an embodiment of the present invention may provide one of the first 3-level single-ended signal OUT1 and the second 3-level single-ended signal OUT2 to the mixer 360.

Figure 6:
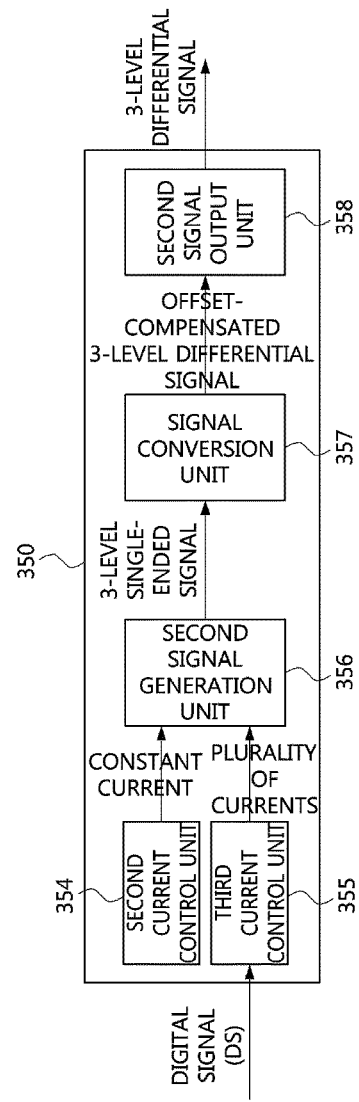
FIG. 6 is a block diagram showing a multi-level signal generation unit according to another embodiment of the present invention.

FIG. 6 is a block diagram showing a multi-level signal generation unit according to another embodiment of the present invention.

Referring to FIG. 6, the multi-level signal generation unit 350 according to another embodiment of the present invention includes a second current control unit 354, a third current control unit 355, a second signal generation unit 356, a signal conversion unit 357, and a second signal output unit 358.

The second current control unit 354 may provide a plurality of constant currents to the second signal generation unit 356 to be described below.

The third current control unit 355 may be connected to an output of the modulator 340. The third current control unit 355 may receive the digital signal DS from the modulator 340. In addition, the third current control unit 355 may provide a plurality of control currents to the second signal generation unit 356 to be described below based on the received digital signal DS.

The second signal generation unit 356 may be connected to an output of the second current control unit 354 and an output of the third current control unit 355. Here, the second signal generation unit 356 may receive a plurality of constant currents from the second current control unit 354. Here, the second signal generation unit 356 may receive a plurality of control currents from the third current control unit 355.

In addition, the second signal generation unit 356 may generate third and fourth 3-level single-ended signals based on the received plurality of constant currents and plurality of control currents. Furthermore, the second signal generation unit 356 may provide the generated third and fourth 3-level single-ended signals to the signal conversion unit 357 to be described below.

The signal conversion unit 357 may be connected to an output of the second signal generation unit 356. The signal conversion unit 357 may receive the third and fourth 3-level single-ended signals from the second signal generation unit 356. In addition, the signal conversion unit 357 may convert the received third and four 3-level single-ended signals into a 3-level differential signal. Here, the 3-level differential signal may be a signal compensated for the predetermined offset.

In addition, the signal conversion unit 357 may provide the converted 3-level differential signal to the second signal output unit 358 to be described below.

The second signal output unit 358 may be connected to an output of the signal conversion unit 357. The second signal output unit 358 may receive the 3-level differential signal from the signal conversion unit 357. In addition, the second signal output unit 358 may provide the received 3-level differential signal to the mixer 360.

In the advanced class-S transmission apparatus, an adjacent channel leakage ratio (ACLR) or an error vector magnitude (EVM) are determined by the performance of the delta-sigma modulator when a signal-to-noise ratio (SNR) of the delta-sigma modulator is low (~40 dB). When the SNR of the delta-sigma modulator is sufficiently high, the entire performance of the transmission apparatus is determined by LO leakage from the mixer.

Accordingly, the transmission apparatus according to an embodiment of the present invention may drive the mixer using the differential signal generated by the multi-level signal generation unit, thereby reducing the LO leakage from the mixer to operate at an optimum performance.

Figure 7:
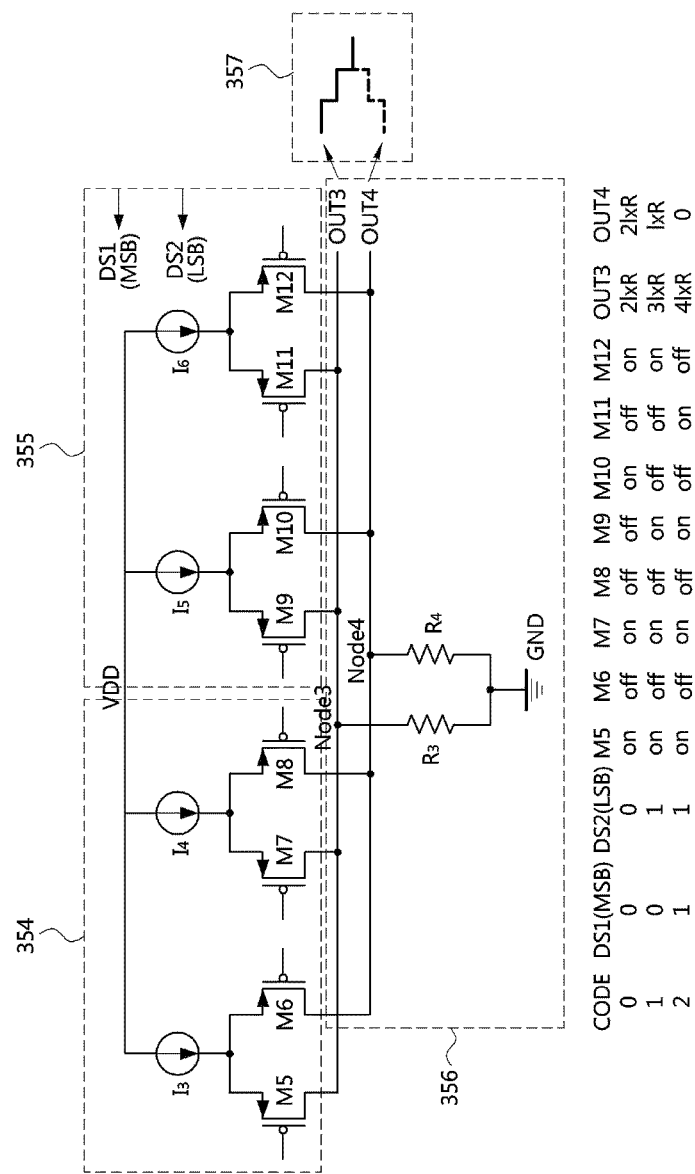
FIG. 7 is a circuit diagram showing a circuit of the multi-level signal generation unit shown in FIG. 6 and a state table showing an operation state.

FIG. 7 is a circuit diagram showing a circuit of the multi-level signal generation unit shown in FIG. 6 and a state table showing an operation state.

Referring to FIG. 7, the second current control unit 354 may provide the plurality of constant currents. In addition, the second current control unit 354 may include a plurality of transistors and a plurality of current sources.

Here, the plurality of current sources may provide a constant current. Here, the plurality of current sources may have the same value. Here, the plurality of current sources may include two current sources $I_3$ and $I_4$. One ends of the two current sources $I_3$ and $I_4$ may be connected to a voltage VDD.

Here, the plurality of transistors may include four transistors M5 to M8. The four transistors M5 to M8 may perform a turn-on or turn-off operation according to a signal applied to gates of the four transistors M5 to M8.

The gates of the two transistors M5 and M7 are connected to the ground and thus the transistors M5 and M7 may maintain the turn-on state. In addition, the gates of the two transistors M6 and M8 are connected to a constant voltage and thus the transistors M6 and M8 may maintain the turn-off state.

The fifth transistor M5 may include a gate, a source, and a drain. The gate of the fifth transistor M5 may be connected to the ground. The source of the fifth transistor M5 may be connected to the other end of the third current source $I_3$. The drain of the fifth transistor M5 may be connected to a third node.

The sixth transistor M6 may include a gate, a source, and a drain. Here, the gate of the sixth transistor M6 may be connected to a constant voltage. The source of the sixth transistor M6 may be connected to the other end of the third current source $I_3$. The drain of the sixth transistor M6 may be connected to a fourth node.

The seventh transistor M7 may include a gate, a source, and a drain. Here, the gate of the seventh transistor M7 may be connected to the ground. The source of the seventh transistor M7 may be connected to the other end of the fourth current source $I_4$. The drain of the seventh transistor M7 may be connected to the third node.

The eighth transistor M8 may include a gate, a source, and a drain. Here, the gate of the eighth transistor M8 may be connected to a constant voltage. The source of the eighth transistor M8 may be connected to the other end of the fourth current source $I_4$. The drain of the eighth transistor M8 may be connected to the fourth node.

Each of the transistors M5 to M8 may be, but not limited to, a PMOS transistor as shown in FIG. 7 and may include any device as long as the device can provide a constant current according to a switching operation.

The third current control unit 355 may provide a plurality of control currents based on the digital signal DS. Moreover, the third current control unit 355 may provide the plurality of control currents corresponding to the digital signal DS and the inverted signal of the digital signal DS. Here, the digital signal DS may include a first digital signal DS1 and a second digital signal DS2.

In particular, the first digital signal DS1 may be a most significant bit (MSB). The second digital signal DS2 may be a least significant bit (LSB).

In addition, the third current control unit 355 may have the same configuration as the above-described first current control unit 351.

The third current control unit 355 may include a plurality of transistors and a plurality of current sources.

Here, the plurality of current sources may provide a control current. Here, the plurality of current sources may have the same value. Here, the plurality of current sources may include two current sources $I_5$ and $I_6$. One ends of the two current sources $I_5$ and $I_6$ may be connected to a voltage VDD.

Here, the plurality of transistors may include four transistors M9 to M12. The four transistors M9 to M12 may perform a turn-on or turn-off operation according to a signal applied to gates of the four transistors M9 to M12.

Two transistors M10 and M12 may perform a turn-on or turn-off operation according to the digital signals DS1 and DS2 applied to gates of the transistors M10 and M12. Two transistors M9 and M11 may perform a turn-on or turn-off operation according to inverted signals of the digital signals DS1 and DS2 applied to gates of the transistors M9 and M11.

When a signal applied to the gates of the transistors M9 to M12 is logically high, the transistors M9 to M12 are turned off. When the signal is logically low, the transistors M9 to M12 are turned on.

The ninth transistor M9 may include a gate, a source, and a drain. Here, the gate of the ninth transistor M9 may receive the inverted signal of the second digital signal DS2. The source of the ninth transistor M9 may be connected to the other end of the fifth current source $I_5$. The drain of the ninth transistor M9 may be connected to the third node.

The tenth transistor M10 may include a gate, a source, and a drain. Here, the gate of the tenth transistor M10 may receive the second digital signal DS2. The source of the tenth transistor M10 may be connected to the other end of the fifth current source $I_5$. The drain of the tenth transistor M10 may be connected to the fourth node.

The eleventh transistor M11 may include a gate, a source, and a drain. Here, the gate of the eleventh transistor M11 may receive the inverted signal of the first digital signal DS1. The source of the eleventh transistor M11 may be connected to the other end of the sixth current source $I_6$. The drain of the eleventh transistor M11 may be connected to the third node.

The twelfth transistor M12 may include a gate, a source, and a drain. Here, the gate of the twelfth transistor M12 may receive the first digital signal DS1. The source of the twelfth transistor M12 may be connected to the other end of the sixth current source $I_6$. The drain of the twelfth transistor M12 may be connected to the fourth node.

Each of the transistors M9 to M12 may be, but not limited to, a PMOS transistor as shown in FIG. 7 and may include any device as long as the device can provide a control current according to a switching operation.

The second signal generation unit 356 may include a plurality of resistors. Here, the plurality of resistors may include two resistors R3 and R4. The third resistor R3 may be connected between the third node and the ground. The fourth resistor R4 may be connected between the fourth node and the ground. In particular, the third resistor R3 and the fourth resistor R4 may have the same value.

The third resistor R3 may receive constant currents $I_3$ and $I_4$ from the fifth and seventh transistors M5 and M7 which maintain the turn-on state. The third resistor R3 may receive control currents $I_5$ and $I_6$ from the ninth and eleventh transistors M9 and M11.

In addition, the third resistor R3 may generate a third 3-level single-ended signal OUT3 corresponding to the received constant currents $I_3$ and $I_4$ and control currents $I_5$ and $I_6$.

The fourth resistor R4 may be connected to the sixth and eighth transistors M6 and M8 which maintain the turn-off state. The fourth resistor R4 may receive the control currents $I_5$ and $I_6$ from the tenth and twelfth transistors M10 and M12.

In addition, the fourth resistor R4 may generate a fourth 3-level single-ended signal OUT4 corresponding to the received control currents $I_5$ and $I_6$.

The signal conversion unit 357 may receive and convert the third and fourth 3-level single-ended signals OUT3 and OUT4 from the second signal generation unit 356 into a 3-level differential signal compensated for the predetermined offset.

The second signal output unit 358 may receive the 3-level differential signal from the signal conversion unit 357 and provide the received 3-level differential signal to the mixer 360.

Referring to the state table of FIG. 7, the modulator 340 according to an embodiment of the present invention may include two comparators. That is, the modulator 340 may output the digital signals DS1 and DS2 using the two comparators. Here, the modulator 340 may be a delta-sigma modulator.

In addition, the multi-level signal generation unit 350 according to an embodiment of the present invention may generate the third and fourth 3-level single-ended signals OUT3 and OUT4 corresponding to the constant currents $I_3$ and $I_4$ and control currents $I_5$ and $I_6$.

For example, the fifth and seventh transistors M5 and M7 may maintain the turn-on state to provide the constant currents $I_3$ and $I_4$. The sixth and eighth transistors M6 and M8 may maintain the turn-off state.

When the digital signals DS1 and DS2 are logically low, the tenth and twelfth transistors M10 and M12 are turned on upon receiving the digital signals DS1 and DS2, and the ninth and eleventh transistors M9 and M11 are turned off upon receiving the inverted signals of the digital signals DS1 and DS2.

Thus, the third and fourth 3-level single-ended signals OUT3 and OUT4 may have a voltage value of 2I×R.

When one of the first digital signal DS1 and the second digital signal DS2 is logically low and the other is logically high, a transistor to which the logically low digital signal is applied between the tenth and twelfth transistors M10 and M12 that receive the digital signals DS1 and DS2 is turned on, and a transistor to which the logically high digital signal is applied is turned off.

When one of the inverted signals of the first digital signal DS1 and the second digital signal DS2 is logically low and the other is logically high, a transistor to which the logically low inverted signal is applied between the ninth and eleventh transistors M9 and M11 that receive the inverted signals of the digital signals DS1 and DS2 is turned on, and a transistor to which the logically high inverted signal is applied is turned off.

Thus, the third 3-level single-ended signal OUT3 may have a voltage value of 3I×R. The fourth 3-level single-ended signal OUT4 may have a voltage value of I×R.

When the digital signals DS1 and DS2 are logically high, the tenth and twelfth transistors M10 and M12 are turned off upon receiving the digital signals DS1 and DS2, and the ninth and eleventh transistors M9 and M11 are turned on upon receiving the inverted signals of the digital signals DS1 and DS2.

Thus, the third 3-level single-ended signal OUT3 may have a voltage value of 4I×R. The fourth 3-level single-ended signal OUT4 may have a voltage value of 0.

Accordingly, the third 3-level single-ended signal OUT3 may have a voltage value of 2I×R, 3I×R, and 4I×R. In addition, the fourth 3-level single-ended signal OUT4 may have a voltage value of 2I×R, I×R, and 0.

The third and fourth single-ended signals OUT3 and OUT4 may be output as 0/1/2 code having an offset of 2I×R. However, when the third and fourth single-ended signals OUT3 and OUT4 is converted into a differential signal, the differential signal may be output as 0/1/2 code having no offset.

Accordingly, the transmission apparatus according to an embodiment of the present invention may drive the mixer using the differential signal generated by the multi-level signal generation unit, thereby reducing the LO leakage from the mixer.

Figure 8:
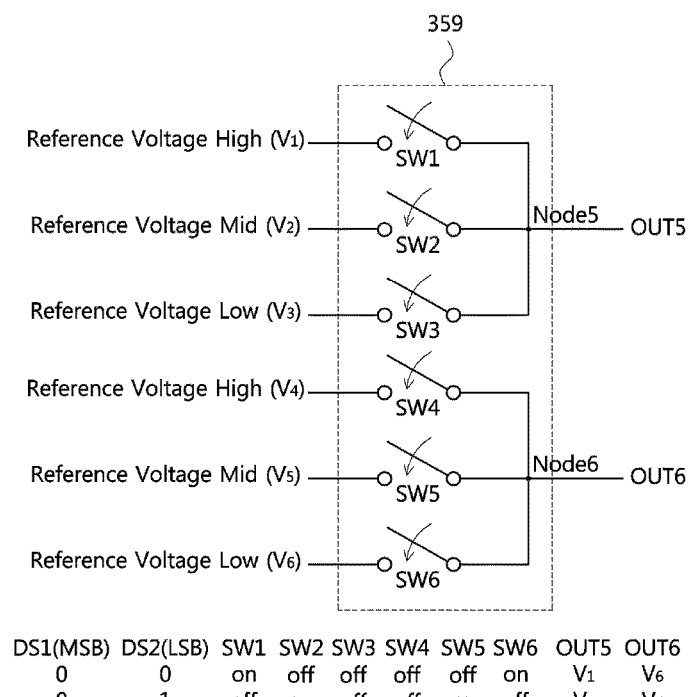
FIG. 8 is a circuit diagram showing a multi-level signal generation unit according to still another embodiment and a state table showing an operation state.

FIG. 8 is a circuit diagram showing a multi-level signal generation unit according to still another embodiment and a state table showing an operation state.

Referring to FIG. 8, the multi-level signal generation unit according to still another embodiment may include an output buffer 359.

The output buffer 359 may perform a switching operation based on the digital signal DS and may generate a 3-level signal compensated for the predetermined offset according to a control voltage corresponding to the switching operation. In addition, the output buffer 359 may provide the offset-compensated 3-level signal to the mixer 360.

Here, the digital signal DS may include a first digital signal DS1 and a second digital signal DS2.

In particular, the first digital signal DS1 may be a most significant bit (MSB). The second digital signal DS2 may be a least significant bit (LSB).

Also, the output buffer 359 may include a plurality of switches. Here, the plurality of switches may include six switches SW1 to SW6.

The first switch SW1 may be connected between a first control voltage V1 and a fifth node.

The second switch SW2 may be connected between a second control voltage V2 and the fifth node.

The third switch SW3 may be connected between a third control voltage V3 and the fifth node.

The fourth switch SW4 may be connected between a fourth control voltage V4 and a sixth node.

The fifth switch SW5 may be connected between a fifth control voltage V5 and the sixth node.

The sixth switch SW6 may be connected between a sixth control voltage V6 and the sixth node.

Each of the plurality of switches SW1 to SW6 may be, but not limited to, a switch that performs an opening or short-circuiting operation as shown in FIG. 8 and may include a transistor for performing a turn-on and turn-off operation.

Referring to the state table of FIG. 8, the first switch SW1 and the sixth switch SW6 are short-circuited when the digital signals DS1 and DS2 are logically low.

Thus, an output signal OUT5 that is generated at the fifth node may have a value of the first control voltage V1. In addition, an output signal OUT6 that is generated at the sixth node may have a value of the sixth control voltage V6.

The second switch SW2 and the fifth switch SW5 are short-circuited when one of the first digital signal DS1 and the second digital signal DS2 is logically low.

Thus, the output signal OUT5 that is generated at the fifth node may have a value of the second control voltage V2. In addition, the output signal OUT6 that is generated at the sixth node may have a value of the fifth control voltage V5.

The third switch SW3 and the fourth switch SW4 are short-circuited when the digital signals DS1 and DS2 are logically high.

Thus, the output signal OUT5 that is generated at the fifth node may have a value of the third control voltage V3. In addition, the output signal OUT6 that is generated at the sixth node may have a value of the fourth control voltage V4.

Accordingly, when the digital signals DS1 and DS2 are 0 and 0, 0 and 1, and 1 and 1, the output signal OUT5 that is generated at the fifth node has a value of V1/V2/V3, and the output signal OUT6 that is generated at the sixth node has a value of V6/V5/V4.

Here, the first to sixth control voltages V1 to V6 may have different values.

For example, the first control voltage V1 may be greater than the second control voltage V2, and the second control voltage V2 may be greater than the third control voltage V3 (that is, V1>V2>V3).

Here, the fourth control voltage V4 may be greater than the fifth control voltage V5, and the fifth control voltage V5 may be greater than the sixth control voltage V6 (that is, V4>V5>V6).

That is, the output buffer 359 according to an embodiment of the present invention may generate a 3-level signal compensated for the predetermined offset according to the first to sixth control voltages V1 to V6.

As an example, the first control voltage V1 and the fourth control voltage V4 may have a value of 4×Vref, the second control voltage V2 and the fifth control voltage V5 may have a value of 2×Vref, and the third control voltage V3 and the sixth control voltage V6 may have a value of 0.

Thus, the output signal OUT5 that is generated at the fifth node may have a value of 4×Vref, 2×Vref, and 0. In addition, the output signal OUT6 that is generated at the sixth node may have a value of 0, 2×Vref, 4×Vref. Here, the output signals OUT5 and OUT6 that are generated at the fifth and sixth nodes may be a 3-level signal compensated for the predetermined offset.

Accordingly, the output buffer 359 may provide one of the output signal OUT5 that is generated at the fifth node and the output signal OUT6 that is generated at the sixth node to the mixer 360 in the form of a single-ended signal.

As another example, the first control voltage V1 may have a value of 2×Vref, the second control voltage V2 may have a value of Vref, the third control voltage V3 may have a value of 0, the fourth control voltage V4 may have a value of 4×Vref, the fifth control voltage V5 may have a value of 3×Vref, and the sixth control voltage V6 may have a value of 2×Vref.

In this case, the output signal OUT5 that is generated at the fifth node may have a value of 2×Vref, Vref, and 0. In addition, the output signal OUT6 that is generated at the sixth node may have a value of 2×Vref, 3×Vref, and 4×Vref.

Accordingly, the output buffer 359 may provide the output signal OUT5 that is generated at the fifth node and the output signal OUT6 that is generated at the sixth node to the mixer 360 in the form of a differential signal. Here, the differential signal form may be a 3-level signal compensated for the predetermined offset.

A transmission method including a method of generating a differential signal according to an embodiment of the present invention will be described below with reference to the accompanying drawings. In particular, for brevity, repetitive description on the same elements as the transmission apparatus including the apparatus for generating a differential signal according to an embodiment of the present invention may be omitted.

Figure 9:
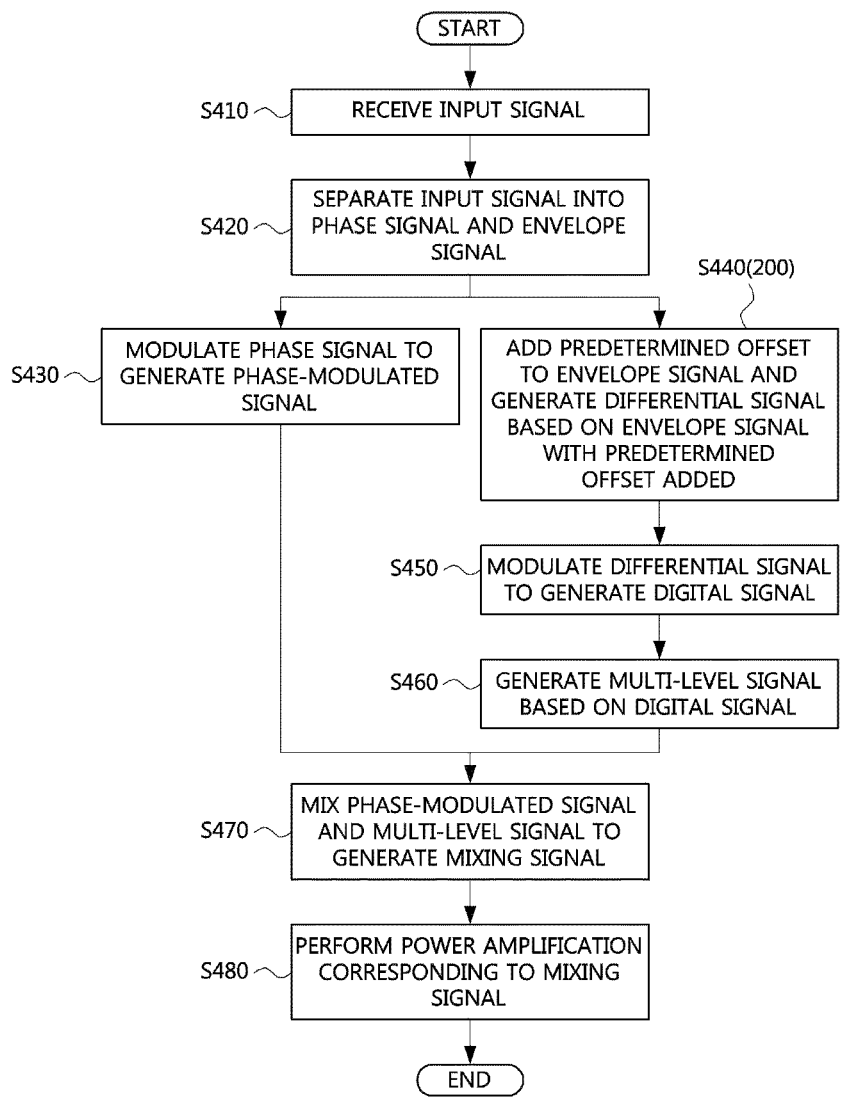
FIG. 9 is a flowchart showing a transmission method including a method of generating a differential signal according to an embodiment of the present invention.

FIG. 9 is a flowchart showing a transmission method including a method of generating a differential signal according to an embodiment of the present invention.

Figure 10:
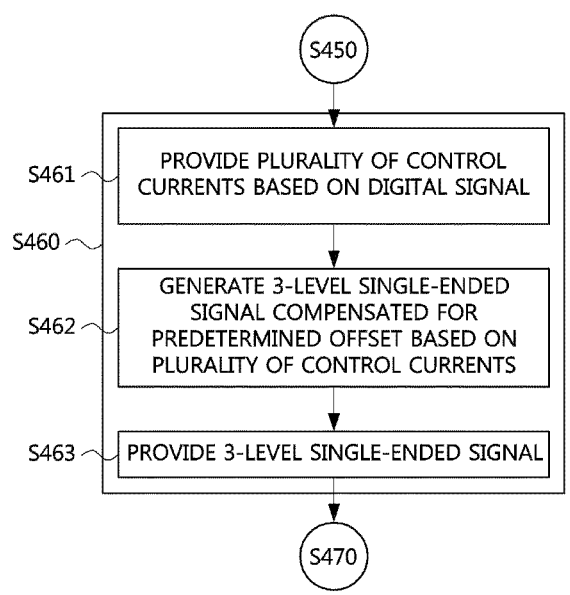
FIGS. 10 to 12 are flowcharts showing a method of generating a multi-level signal according to an embodiment of the present invention.
Figure 11:
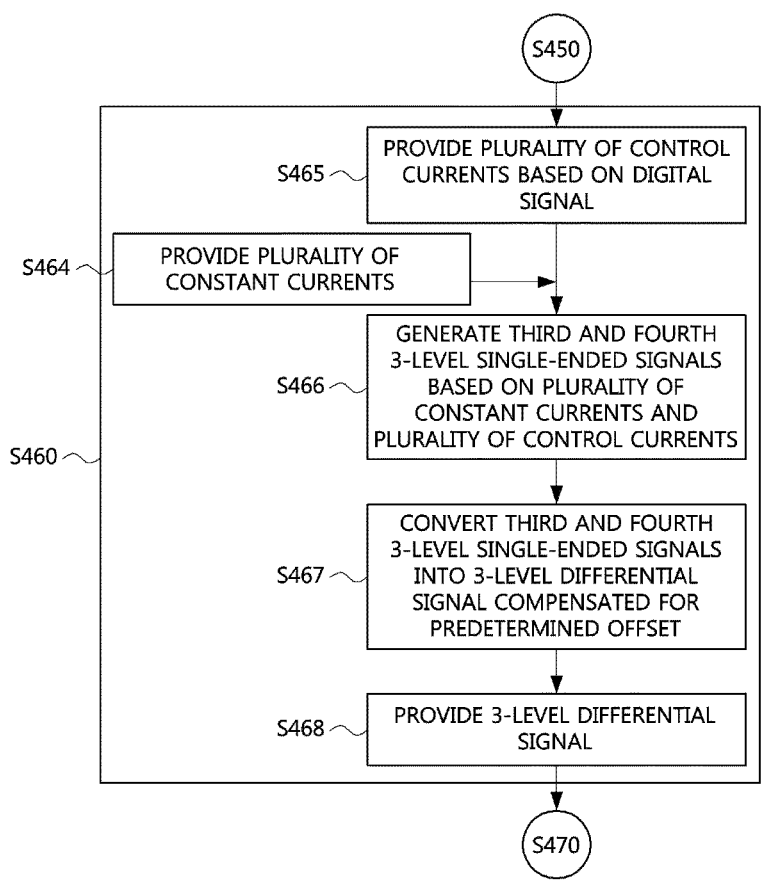
Figure 12:
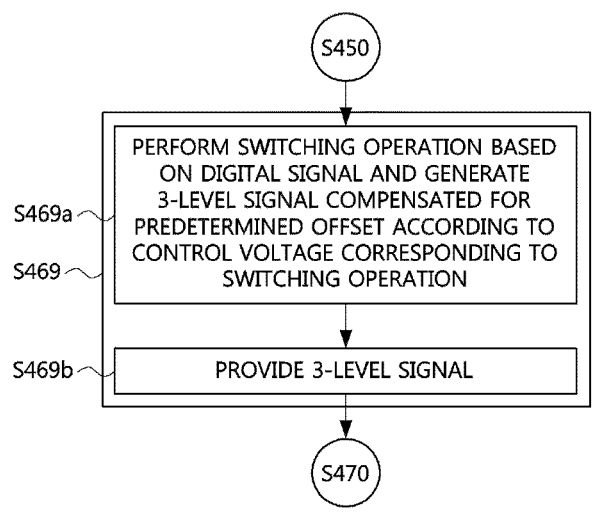

FIGS. 10 to 12 are flowcharts showing a method of generating a multi-level signal according to an embodiment of the present invention.

Referring to FIG. 9, the transmission method including the method of generating a differential signal according to an embodiment of the present invention includes separating an input signal into a phase signal and an envelope signal to provide the phase signal and the envelope signal (S420), generating a phase-modulated signal (S430), generating a differential signal (S440), generating a digital signal (S450), generating a multi-level signal (S460), generating a mixing signal (S470), and performing power amplification (S480).

First, the transmission method includes receiving an input signal from a modem (S410). Here, the input signal may be a baseband signal.

Subsequently, the method includes separating the input signal into a phase signal and an envelope signal to provide the phase signal and the envelope signal (S420). Here, the envelope signal may be a single-ended signal. Here, since the envelope signal is the same as that above described in the transmission apparatus including the apparatus for generating a differential signal, repetitive description thereof will be omitted for brevity.

Subsequently, the method may include phase-modulating the phase signal to generate a phase-modulated signal having a constant amplitude (S430).

Subsequently, the method may include adding a predetermined offset to the received envelope signal such that the signal has the same magnitude with respect to 0 and generating a differential signal based on the envelope signal with the added predetermined offset (S440).

Here, the generating of the differential signal (S440) may include generating a first signal (S220), generating a second signal (S230), generating a third signal (S240), forming a differential signal (S250), and forming a differential signal with a common mode voltage added (S260). Here, since the above-described operations are the same as the above-described method of generating a differential signal (S200), for brevity, repetitive description will be omitted.

After the generating of the differential signal (S440), the method may include modulating the differential signal to generate a digital signal (S450).

Subsequently, the method may include generating a multi-level signal corresponding to the digital signal (S460).

In addition, the generating of the multi-level signal (S460) may include compensating for a predetermined offset based on the digital signal as shown in FIGS. 10 to 12, to generate the multi-level signal.

Referring to FIG. 10, first, the generating of the multi-level signal (S460) may include providing a plurality of control currents based on the digital signal (S461).

Subsequently, the method may include generating a 3-level single-ended signal compensated for the predetermined offset based on the plurality of control currents (S462).

Next, the method may include providing the 3-level single-ended signal (S463).

Here, the generating of the multi-level signal (S460) may include generating a first 3-level single-ended signal compensated for the predetermined offset corresponding to the digital signal, generating a second 3-level single-ended signal compensated for the predetermined offset corresponding to the inverted signal of the digital signal, and providing one of the first 3-level single-ended signal and the second 3-level single-ended signal.

Referring to FIG. 11, first, the generating of the multi-level signal (S460) may include providing a plurality of constant currents (S464).

Subsequently, the method may include providing a plurality of control currents based on the digital signal (S465).

Next, the method may include generating third and fourth 3-level single-ended signals based on the plurality of constant currents and the plurality of control currents (S466).

Next, the method may include converting the third and fourth 3-level single-ended signals into a 3-level differential signal compensated for the predetermined offset (S467).

Next, the method may include providing the 3-level differential signal (S468).

Referring to FIG. 12, the generating of the multi-level signal (S460) may include performing a switching operation based on the digital signal and generating a 3-level signal compensated for the predetermined offset according to a control voltage corresponding to the switching operation (S469a).

Subsequently, the method may include providing the 3-level signal compensated for the predetermined offset (S469b).

Referring to FIG. 9, after the generating of the multi-level signal (S460), the method may include mixing the phase-modulated signal and the multi-level signal to generate a mixing signal (S470).

Next, the method may include performing power amplification corresponding to the mixing signal and providing the power-amplified signal (S480).

Figure 13:
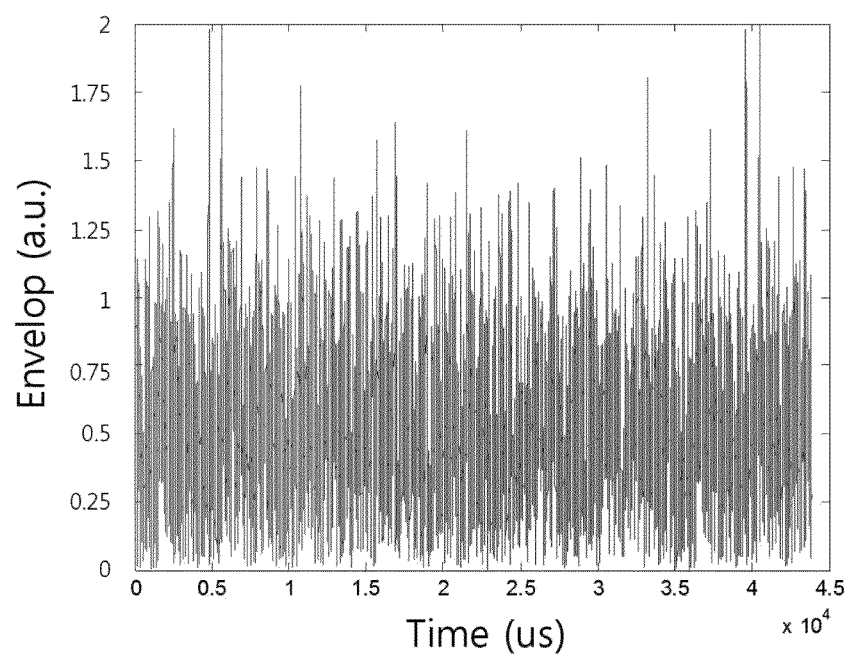
FIG. 13 is a graph showing an envelope signal which is a single-ended signal.

A process of converting an envelope signal, which is a single-ended signal, into a differential signal according to an embodiment will be described with reference to the accompanying drawings (FIGS. 13 and 14).

FIG. 13 is a graph showing an envelope signal which is a single-ended signal.

FIG. 14 is a graph showing a process of converting an envelope signal shown in FIG. 11 into a differential signal according to an embodiment of the present invention.

Referring to FIG. 13, an envelope signal provided by an LTE modem or polar coordinate conversion unit may be a single-ended signal having a positive value as shown in FIG. 13. Here, the envelope signal may a baseband signal.

The envelope signal may be reshaped in various methods in order to be input to a delta-sigma modulator. That is, the signal quality of the transmission apparatus may be maintained or degraded depending on how the envelope signal is reshaped.

In particular, the transmission apparatus does not operate properly only with noise-shaping of the envelope signal by the delta-sigma demodulator.

Accordingly, a differential signal is suitable, as the input signal applied to the delta-sigma modulator, to minimize the noise effect of the circuit and maximize the magnitude of the input signal. Here, the differential signal may move with respect to a common mode voltage (CMV).

Referring to FIG. 14, an envelope signal with a positive value may be provided. Subsequently, a predetermined offset may be added to the envelope signal such that the envelope signal has the same magnitude with respect to 0 to generate a first signal.

Figure 14A:
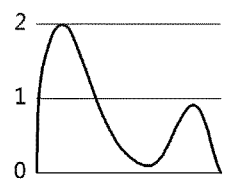
FIGS. 14A, 14B, 14C, 14D and 14E are graphs showing a process of converting an envelope signal shown in FIG. 11 into a differential signal according to an embodiment of the present invention.
Figure 14B:
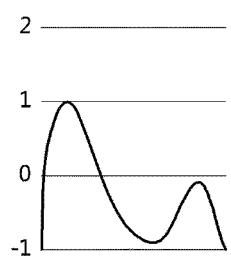

For example, since the envelope signal in FIG. 14A has the magnitude of 0 to 2, the offset of −1 may be added to the envelope signal such that the first signal in FIG. 14B has the magnitude between −1 and 1. In addition, if the envelope signal in FIG. 14A has the magnitude of 0 to 3, the offset of −1.5 may be added to the envelope signal such that the first signal in FIG. 14B has the magnitude between −1.5 and 1.5.

In particular, compensation may be subsequently performed for the predetermined offset added to the envelope signal at an output end. Here, the output end may be a part in which the multi-level signal is generated.

That is, the offset compensation at the output end may be performed by multiplying the predetermined offset added to the envelope signal by a negative absolute value. For example, if the predetermined offset added to the envelope signal is −1, the offset compensation at the output end may performed by adding an offset of +1. When the envelope signal in FIG. 14A has the magnitude of 0 to 2 and the predetermined offset is added to generate a differential signal, the offset compensation is performed at the output end to maintain the form of the envelope signal.

Subsequently, the first signal having the magnitude of 2 in FIG. 14B may be scaled to a magnitude that can be processed in the circuit to generate a second signal. For example, when the maximum differential input that can be processed in the circuit has the magnitude of 1 Vp-p, the second signal having the magnitude of ±0.25 Vp-p may be generated by multiplying the first signal having the magnitude of 2 in FIG. 14B by 0.25.

Figure 14C:
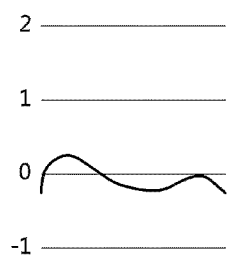

Subsequently, a third signal may be generated by multiplying the second signal in FIG. 14C by −1, and the differential signal may be formed using the second signal and the third signal. Here, the differential signal in FIG. 14D may be a signal having the magnitude of 1.

Figure 14D:
Figure 14E:
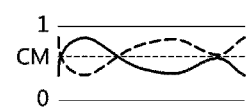

Subsequently, a common mode voltage is added to the differential signal in FIG. 14D to generate a differential signal with the common mode voltage added. Here, compensation need not be performed for the common mode voltage at the output end. This is because the same offset added to the differential signal pair in FIG. 14D is considered to be no offset.

A method of reshaping input/output signals of the delta-sigma modulator according to an embodiment of the present invention and characteristics of the method will be described below with reference to the accompanying drawings (FIGS. 15A to 15F), compared to a conventional method and characteristics thereof.

Figure 15A:
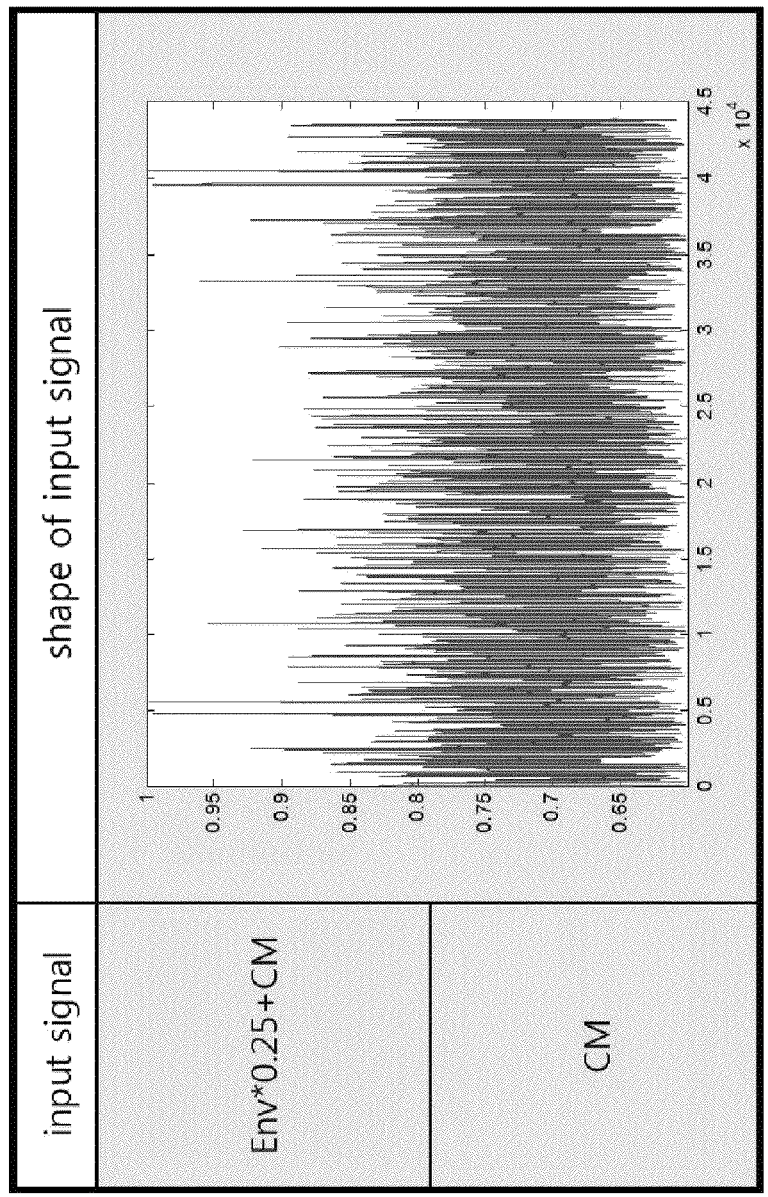
FIGS. 15A, 15B and 15C are graphs showing an input signal shape of a delta-sigma modulator, which is generated through a conventional reshaping method.
Figure 15B:
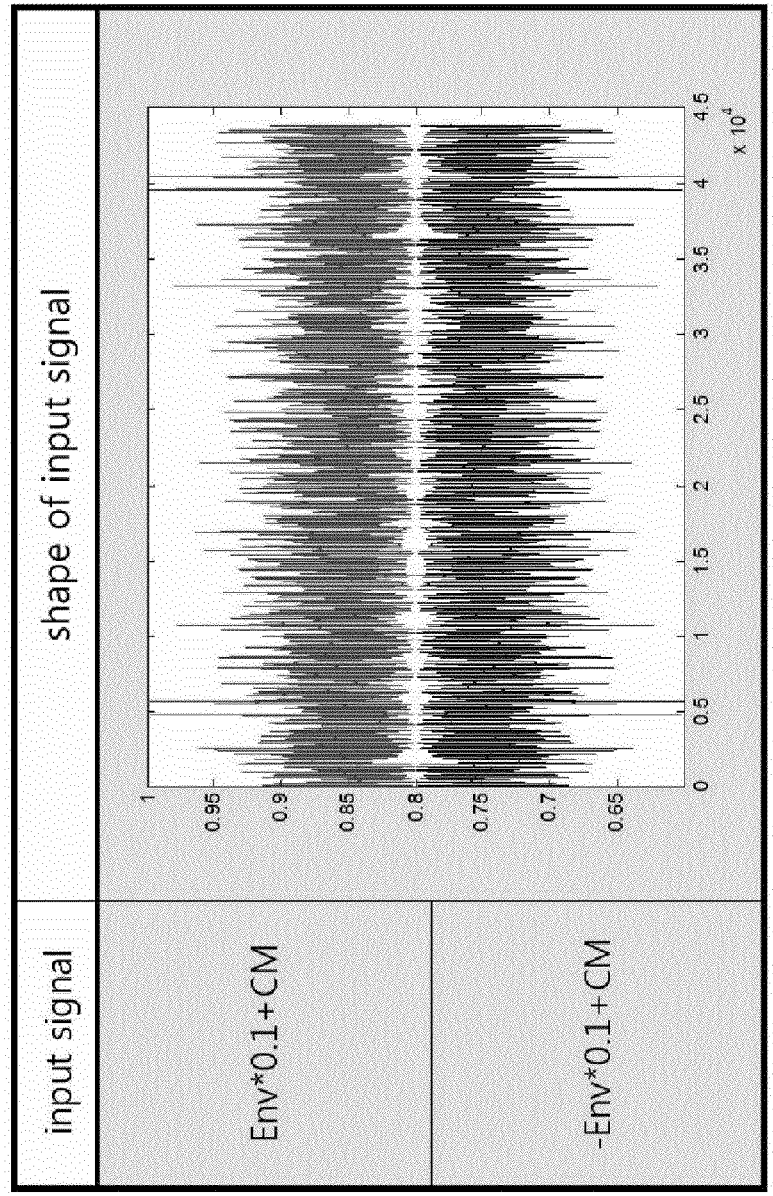
Figure 15C:
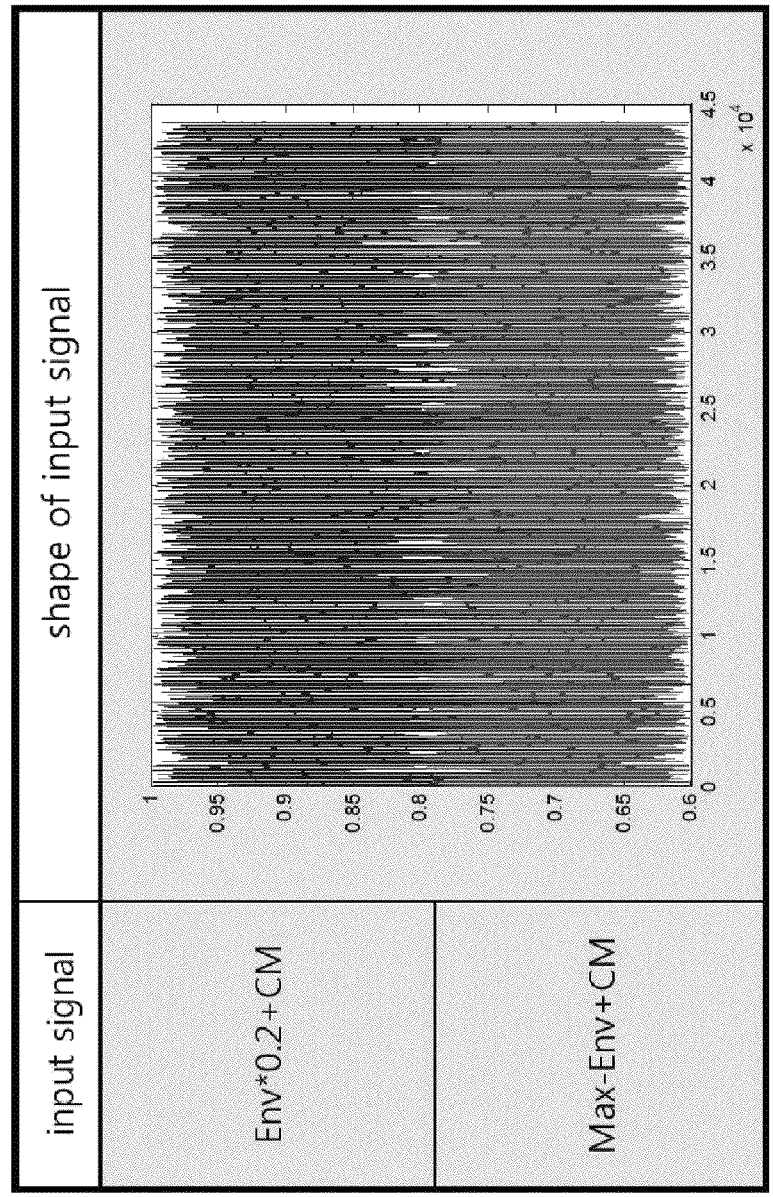

FIGS. 15A to 15C are graphs showing an input signal shape of a delta-sigma modulator, which is generated through a conventional reshaping method.

Table 1 below indicates a reshaping method for generating the input signal shape of the delta-sigma modulator shown in FIGS. 15A to 15C and characteristics of the reshaping method.

TABLE 1

| | | Reshape of input signal | | | Reshape of output signal | | Output | | |
| --- | --- | --- | --- | --- | --- | --- | --- | --- | --- |
| | | Envelope signal | Offset | Scaling | Offset (CM) | Offset | Scaling | signal | EVM | Remarks |
| 15a | Max | 2 | 0 | 0.25 | CM | 0 | — | 0/1/2 | 12.52 | single input |
| | Min | 0 | | | | | | | | |
| 15b | Max | 2 | 0 | 0.1 | CM | 0 | — | 0/1/2 | 12.52 | differential w/o offset |
| | Min | 0 | | | | | | | | |
| 15c | Max | 2 | 0 | 0.2 | CM | −1 | — | 0/1/2 | 69.5 | differential using max value |
| | Min | 0 | | | | | | | | |

Referring to FIGS. 15A to 15C and Table 1, FIG. 15A represents a single-ended signal that is generated by only scaling an envelope signal properly for an input of a delta-sigma modulator without adding an offset to the envelope signal.

Since an offset is not added to the single-ended signal of FIG. 15A, which is an input signal of the delta-sigma modulator, offset compensation need not be performed additionally on an output signal of the delta-sigma modulator. However, the delta-sigma modulator cannot receive a full scale of the single-ended signal and therefore an error vector magnitude (EVM) is about 12%.

FIG. 15B represents a differential signal that is generated by scaling the envelope signal properly for each of a positive input and a negative input of the delta-sigma modulator without adding an offset to the envelope signal. Also in this case, the delta-sigma modulator cannot receive a full scale of the differential signal and therefore an error vector magnitude (EVM) is about 12%.

FIG. 15C represents a differential signal that is generated based on a MAX signal without adding an offset to the envelope signal. In this case, since the offset is considered to be added to only one input in terms of the entire signal, it can be seen that the EVM is severely degraded, which is about 70%.

Figure 15D:
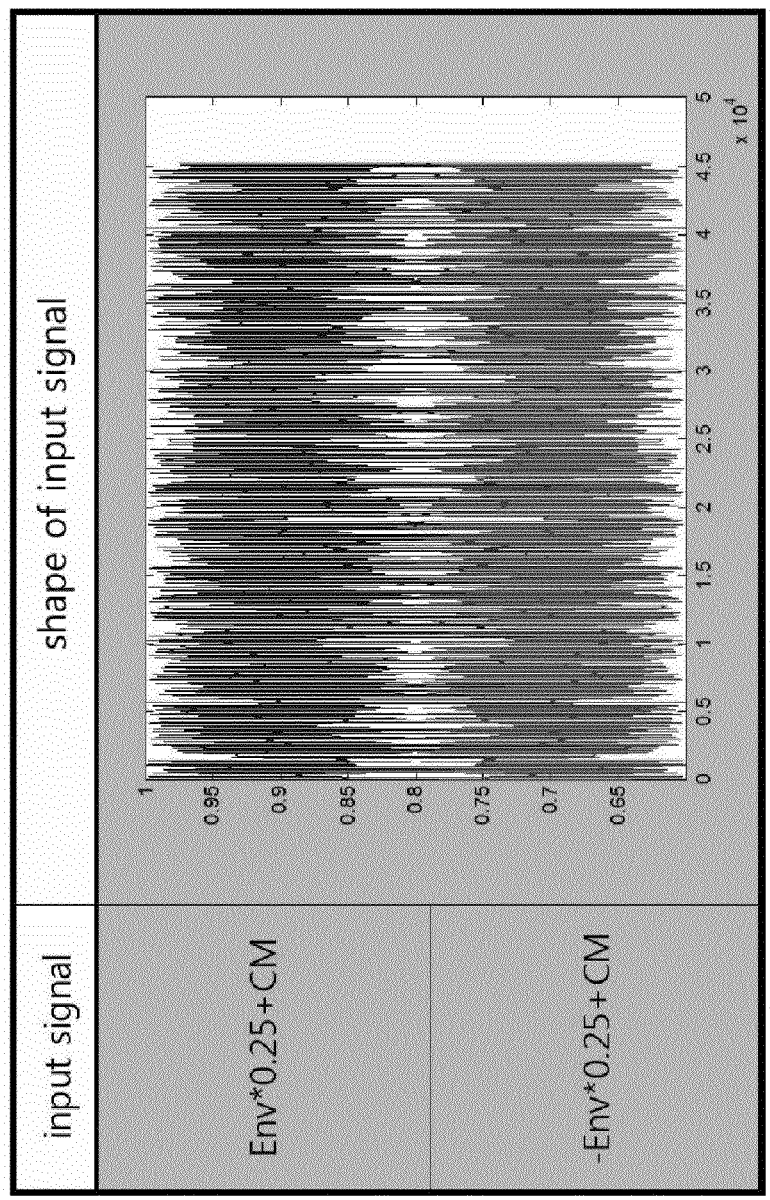
FIGS. 15D, 15E and 15F are graphs showing an input signal shape of a delta-sigma modulator, which is generated according to an embodiment of the present invention.
Figure 15E:
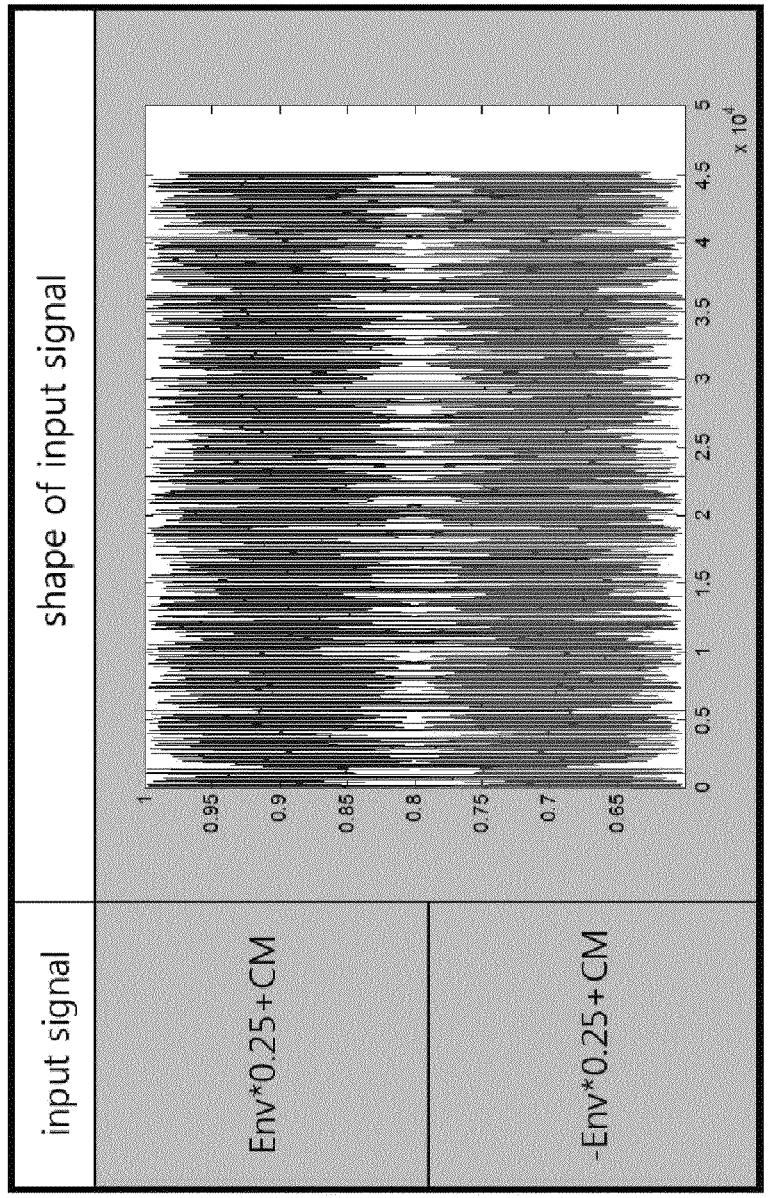
Figure 15F:
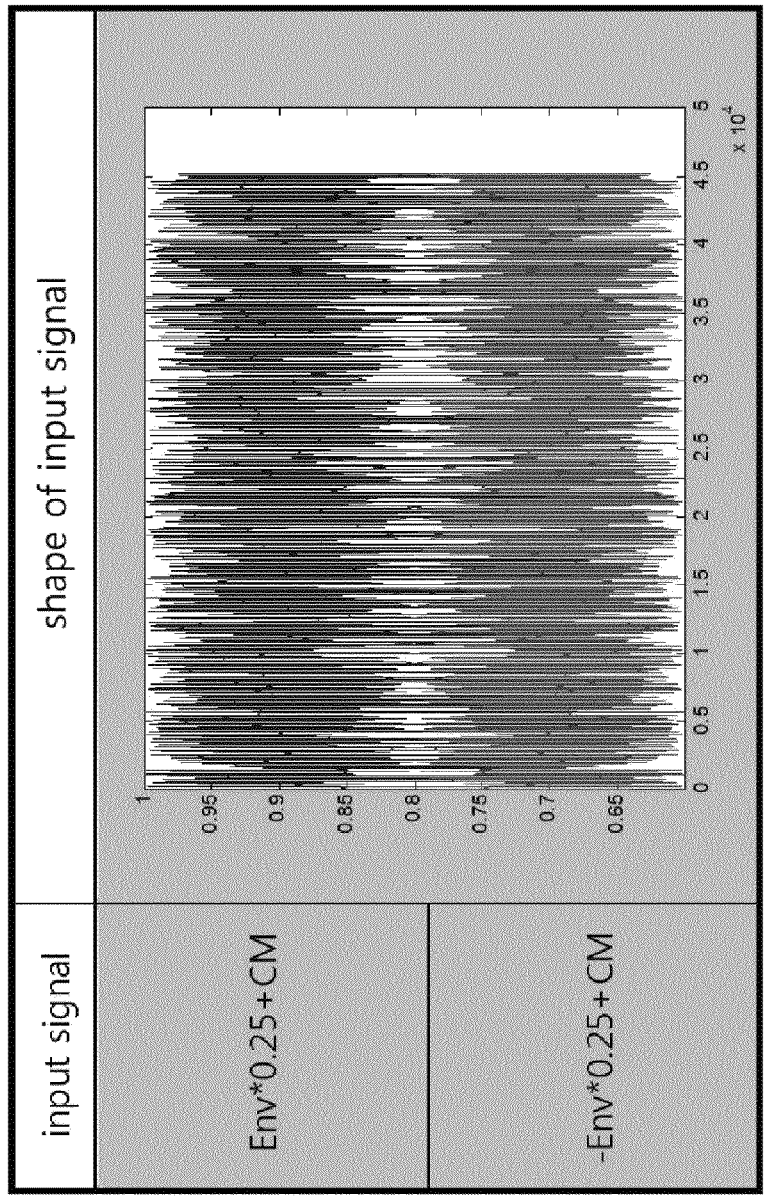

FIGS. 15D to 15F are graphs showing an input signal shape of a delta-sigma modulator, which is generated according to an embodiment of the present invention.

Table 2 below indicates a reshaping method for generating the input signal shape of the delta-sigma modulator shown in FIGS. 15D to 15F and characteristics of the reshaping method.

TABLE 2

| | | Reshape of input signal | | | Offset | Reshape of output signal | | Output | | |
|---|---|---|---|---|---|---|---|---|---|---|
| | | Envelope signal | Offset | Scaling | (CM) | Offset | Scaling | signal | EVM | Remarks |
| 15d | Max<br>Min | 2<br>0 | −1 | 0.25 | CM | 1 | — | 0/1/2 | 2.38 | differential w/o offset |
| 15e | Max<br>Min | 2<br>0 | −1 | 0.25 | CM | 1 | 0.5 | 0/0.5/1 | 2.38 | differential w/o offset + output offset & scaling |
| 15f | Max<br>Min | 2<br>0 | −1 | 0.25 | CM | 0/8 | — | −0.2/0.8/1.8 | 21.51 | differential w/o offset + output offset & scaling |

Referring to FIGS. 15D to 15F and Table 2, FIGS. 15D to 15F each represent a differential signal that is generated based on an offset that is added to an envelope signal according to an embodiment of the present invention.

As shown in FIGS. 15D to 15F and Table 2, it can be seen that the differential signal generated according to an embodiment of the present invention uses a full dynamic range of the delta-sigma modulator.

In particular, as shown in Table 2, it can be seen from FIGS. 15D and 15E that the EVM is very good, which is 2.38%.

Meanwhile, FIG. 15E represents a case in which scaling is applied at the output end of the delta-sigma modulator. As shown in FIG. 15F and Table 2, it can be seen that the scaling at the output end does not affect the signal quality of the transmission apparatus.

This means that the scaling need not be performed properly for an input rage of the mixer in designing the output end of the delta-sigma modulator. Accordingly, a magnitude of a signal output from the delta-sigma modulator can be just adjusted properly for the input magnitude of the mixer.

It can be seen from the above-description that an input signal is required to be applied having at a full scale range of the delta-sigma modulator in order to enhance the signal quality of the transmission apparatus.

Accordingly, the differential signal generated according to an embodiment of the present invention can be applied to the delta-sigma modulator at a full scale, thereby further enhancing the signal quality of the transmission apparatus.

FIG. 16 shows a graph showing an error vector magnitude (EVM) of the transmission apparatus when the input/output signal of the delta-sigma modulator is reshaped according to an embodiment of the present invention.

Figure 16A:
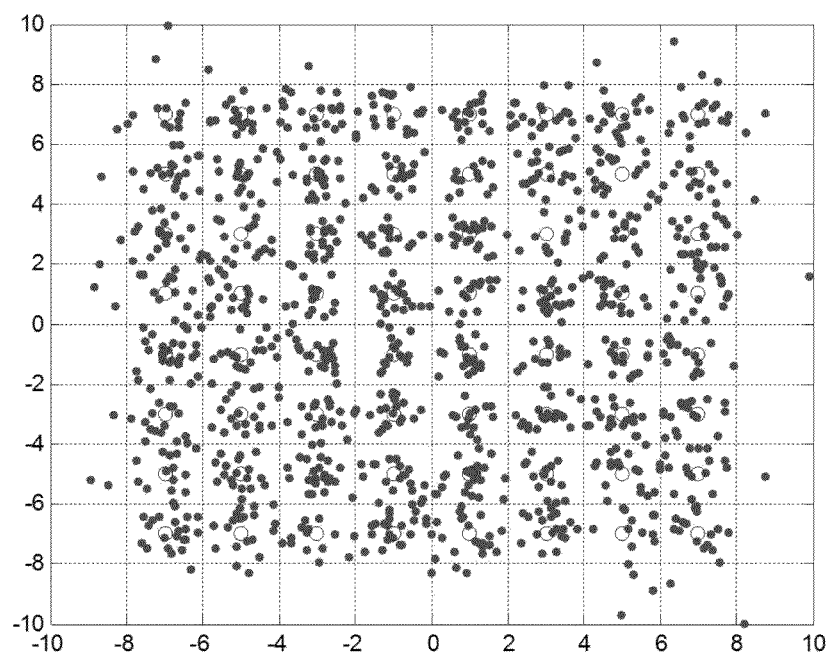
FIGS. 16A and 16B are graphs showing an error vector magnitude (EVM) of the transmission apparatus when the input/output signal of the delta-sigma modulator is reshaped according to the conventional art and an embodiment of the present invention.

Referring to FIG. 16, a graph FIG. 16A shows the EVM of the transmission apparatus when a differential signal generated by conventionally reshaping the input/output signal of the delta-sigma modulator is not applied to the delta-sigma modulator at a full scale.

In this case, it can be seen that the EVM of the transmission apparatus is 12.52% and constellation is very chaotic.

Figure 16B:
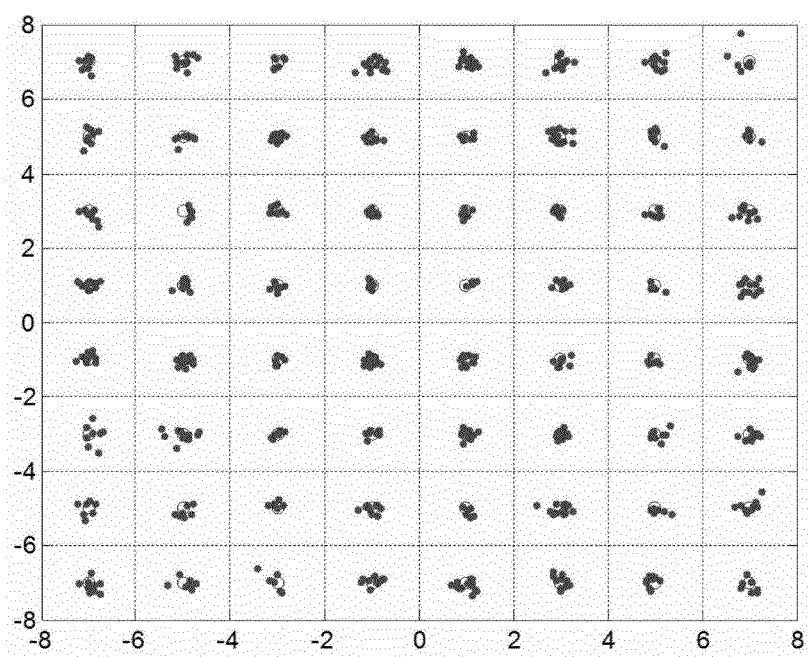

A graph FIG. 16B shows the EVM of the transmission apparatus when the delta-sigma modulator is driven with the differential signal generated according to an embodiment of the present invention.

In this case, it can be seen that the EVM of the transmission apparatus is 2.38% and constellation is well formed.

Accordingly, it can be seen that the EVM of the transmission apparatus is further enhanced when the delta-sigma modulator is driven using the differential signal generated according to an embodiment of the present invention rather than the differential signal generated through the conventional reshaping method.

It can be seen from the above-description that the signal quality of the transmission apparatus largely depends on how the input/output signal of the delta-sigma modulator is processed.

FIG. 17 is a graph showing an adjacent channel leakage ratio (ACLR) of the transmission apparatus when the output signal of the delta-sigma modulator is reshaped according to an embodiment of the present invention.

Figure 17A:
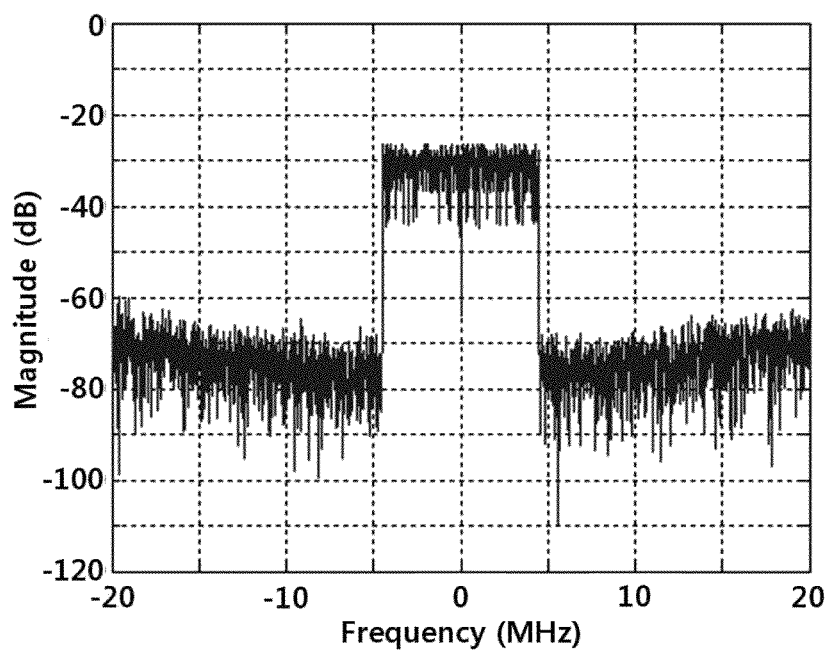
FIGS. 17A and 17B are graphs showing an adjacent channel leakage ratio (ACLR) of the transmission apparatus when the output signal of the delta-sigma modulator is reshaped according to an embodiment of the present invention.

Referring to FIG. 17, a graph FIG. 17A shows an ACLR when the mixer is driven using the single-ended signal generated by the multi-level signal generation unit according to an embodiment of the present invention.

In this case, the ACLR of the transmission apparatus is about 42 dB.

Figure 17B:
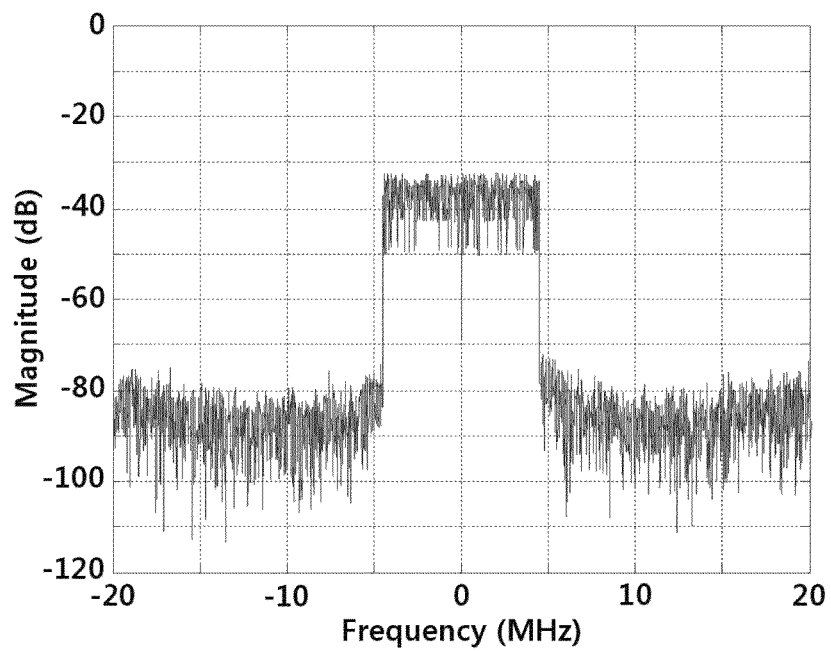

A graph FIG. 17B shows an ACLR when the mixer is driven using the differential signal generated by the multi-level signal generation unit according to an embodiment of the presenting invention.

In this case, the ACLR of the transmission apparatus is about 48 dB.

Accordingly, the transmission apparatus according to an embodiment of the present invention may drive the mixer using an output signal generated by the multi-level signal generation unit, thereby reducing the LO leakage from the mixer.

In particular, the transmission apparatus according to an embodiment of the present invention may drive the mixer using a differential signal generated by the multi-level signal generation unit, thereby minimizing the LO leakage from the mixer.

Accordingly, the transmission apparatus including the apparatus for generating a differential signal according to an embodiment of the present invention may process the input/output signal of the modulator as the differential signal, thereby further enhancing the ACLR and the EVM of the transmission apparatus.

The differential signal generated according to an embodiment of the present invention can be provided as a full-scale input signal to a modulator, thereby enhancing the signal quality of the transmission apparatus.

In addition, the noise effect of the transmission apparatus can be minimized by driving the modulator using the differential signal, thereby operating the transmission apparatus at an optimum performance.

Moreover, the adjacent channel leakage ratio (ACLR) and an error vector magnitude (EVM) of the transmission apparatus can be further enhanced by processing the input/output signal of the modulator as the differential signal.

Furthermore, the LO leakage of the mixer can be reduced by driving the mixer using the output signal generated by the multi-level signal generation unit.

While the example embodiments of the present invention and their advantages have been described in detail, it should be understood that various changes, substitutions, and alterations may be made herein without departing from the scope of the invention.

What is claimed is:

1. A method of generating a differential signal, the method comprising:
    adding a predetermined offset to an envelope signal to generate a first signal having the same magnitude as the envelope signal with respect to 0;
    scaling the first signal at a predetermined rate to generate a second signal;
    changing a sign of the second signal to generate a third signal that is an inverted signal of the second signal; and
    forming a differential signal using the second signal and the third signal.

2. The method of claim 1, further comprising, after the forming of the differential signal, adding a common mode voltage to the differential signal to generate a differential signal with the common mode voltage added.

3. The method of claim 1, wherein the envelope signal is a single-ended signal.

4. A transmission apparatus comprising:
    a polar coordinate conversion unit configured to separate an input signal into a phase signal and an envelope signal to provide the phase signal and the envelope signal;
    a phase modulator configured to phase-modulate the phase signal to generate a phase-modulated signal having a constant amplitude;
    a differential signal generation unit configured to add a predetermined offset to the envelope signal such that the envelope signal has the same magnitude with respect to 0 and generate a differential signal based on the envelope signal with the predetermined offset added;
    a modulator configured to modulate the differential signal to generate a digital signal;
    a multi-level signal generation unit configured to generate a multi-level signal based on the digital signal;
    a mixer configured to mix the phase-modulated signal and the multi-level signal to generated a mixing signal; and
    a power amplifier configured to perform power amplification corresponding to the mixing signal.

5. The transmission apparatus of claim 4, wherein the differential signal generation unit comprises:
    an offset addition unit configured to add a predetermined offset to the envelope signal to generate a first signal having the same magnitude as the envelope signal with respect to 0;
    a signal scaling unit configured to scale the first signal at a predetermined rate to generate a second signal;
    a sign changing unit configured to change a sign of the second signal to generate a third signal that is an inverted signal of the second signal; and
    a differential signal forming unit configured to form the differential signal using the second signal and the third signal.

6. The transmission apparatus of claim 5, wherein the differential signal generation unit further comprises a voltage addition unit configured to add a common mode voltage to the differential signal to generate a differential signal with the common mode voltage added.

7. The transmission apparatus of claim 4, wherein the multi-level signal generation unit compensates for the predetermined offset added by the differential signal generation unit based on the digital signal to generate the multi-level signal.

8. The transmission apparatus of claim 7, wherein the multi-level signal generation unit comprises:
    a first current control unit configured to provide a plurality of control currents based on the digital signal;
    a first signal generation unit configured to generate a 3-level single-ended signal compensated for the predetermined offset based on the plurality of control currents; and
    a first signal output unit configured to provide the 3-level single-ended signal to the mixer.

9. The transmission apparatus of claim 8,
    wherein the first signal generation unit generates a first 3-level single-ended signal compensated for the predetermined offset based on the plurality of control currents corresponding to the digital signal and generates a second 3-level single-ended signal compensated for the predetermined offset based on the plurality of control currents corresponding to an inverted signal of the digital signal, and
    wherein the first signal output unit provides one of the first 3-level single-ended signal compensated for the predetermined offset and the second 3-level single-ended signal compensated for the predetermined offset to the mixer.

10. The transmission apparatus of claim 7, wherein the multi-level signal generation unit comprises:
    a second current control unit configured to provide a plurality of constant currents;
    a third current control unit configured to provide a plurality of control currents based on the digital signal;
    a second signal generation unit configured to generate third and fourth 3-level single-ended signals based on the plurality of constant currents and the plurality of control currents;
    a signal conversion unit configured to convert the third and fourth 3-level single-ended signals into a 3-level differential signal compensated for the predetermined offset; and
    a second signal output unit configured to provide the 3-level differential signal to the mixer.

11. The transmission apparatus of claim 7, wherein the multi-level signal generation unit comprises an output buffer configured to perform a switching operation based on the digital signal, generate a 3-level signal compensated for the predetermined offset according to a control voltage corresponding to the switching operation, and provide the 3-level signal to the mixer.

12. The transmission apparatus of claim 4, wherein the envelope signal is a single-ended signal.

13. A transmission method comprising:
    separating an input signal into a phase signal and an envelope signal to provide the phase signal and the envelope signal;
    phase-modulating the phase signal to generate a phase-modulated signal having a constant amplitude;
    adding a predetermined offset to the envelope signal such that the envelope signal has the same magnitude with respect to 0 and generating a differential signal based on the envelope signal with the predetermined offset added;
    modulating the differential signal to generate a digital signal;
    generating a multi-level signal based on the digital signal;

mixing the phase-modulated signal and the multi-level signal to generated a mixing signal; and performing power amplification corresponding to the mixing signal.

14. The transmission method of claim 13, wherein the generating of the differential signal comprises:

adding the predetermined offset to the envelope signal to generate a first signal having the same magnitude as the envelope signal with respect to 0;

scaling the first signal at a predetermined rate to generate a second signal;

changing a sign of the second signal to generate a third signal that is an inverted signal of the second signal; and forming the differential signal using the second signal and the third signal.

15. The transmission method of claim 14, further comprising, after the forming of the differential signal, adding a common mode voltage to the differential signal to generate a differential signal with the common mode voltage added.

16. The transmission method of claim 13, wherein the generating of the multi-level signal comprises compensating for the predetermined offset based on the digital signal to generate the multi-level signal.

17. The transmission method of claim 16, wherein the generating of the multi-level signal comprises:

providing a plurality of control currents based on the digital signal;

generating a 3-level single-ended signal compensated for the predetermined offset based on the plurality of control currents; and providing the 3-level single-ended signal.

18. The transmission method of claim 17, wherein the generating of the multi-level signal comprises:

generating a first 3-level single-ended signal compensated for the predetermined offset corresponding to the digital signal and generating a second 3-level single-ended signal compensated for the predetermined offset corresponding to an inverted signal of the digital signal; and providing one of the first 3-level single-ended signal and the second 3-level single-ended signal.

19. The transmission method of claim 16, wherein the generating of the multi-level signal comprises:

providing a plurality of constant currents;

providing a plurality of control currents based on the digital signal;

generating third and fourth 3-level single-ended signals based on the plurality of constant currents and the plurality of control currents;

converting the third and fourth 3-level single-ended signals into a 3-level differential signal compensated for the predetermined offset; and providing the 3-level differential signal.

20. The transmission method of claim 16, wherein the generating of the multi-level signal comprises performing a switching operation based on the digital signal and generating a 3-level signal compensated for the predetermined offset according to a control voltage corresponding to the switching operation.

* * * * *